US009583629B2

(12) United States Patent
Nishimura et al.

(10) Patent No.: US 9,583,629 B2
(45) Date of Patent: Feb. 28, 2017

(54) SEMICONDUCTOR DEVICE

(71) Applicant: KABUSHIKI KAISHA TOSHIBA, Minato-ku (JP)

(72) Inventors: Jun Nishimura, Kuwana (JP); Nobuaki Yasutake, Yokkaichi (JP); Takayuki Okamura, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/952,156

(22) Filed: Nov. 25, 2015

(65) Prior Publication Data
US 2016/0079436 A1 Mar. 17, 2016

Related U.S. Application Data

(62) Division of application No. 14/461,720, filed on Aug. 18, 2014, now abandoned.

(Continued)

(51) Int. Cl.
*H01L 29/786* (2006.01)
*H01L 27/24* (2006.01)
(Continued)

(52) U.S. Cl.
CPC ...... *H01L 29/78609* (2013.01); *H01L 27/249* (2013.01); *H01L 27/2454* (2013.01);
(Continued)

(58) Field of Classification Search
None
See application file for complete search history.

(56) References Cited

U.S. PATENT DOCUMENTS 5,410,165 A  4/1995 Kasai
5,827,769 A * 10/1998 Aminzadeh ......... H01L 21/3144
                                              257/E21.268
(Continued)

FOREIGN PATENT DOCUMENTS

JP    5-343689    12/1993
JP    3121676     1/2001
(Continued)

OTHER PUBLICATIONS

Combined Taiwanese Office Action and Search Report issued on May 5, 2016 in Patent Application No. 103129229 (with partial English language translation and English language of categories of cited documents).

*Primary Examiner* — Khaja Ahmad
(74) *Attorney, Agent, or Firm* — Oblon, McClelland, Maier & Neustadt, L.L.P.

(57) ABSTRACT

According to one embodiment, a first transistor includes a first semiconductor region, a second semiconductor region, a third semiconductor region, a first gate insulating film, and a first gate electrode. The first semiconductor region is provided in a first semiconductor layer extending in a second direction substantially perpendicular to the surface of the semiconductor substrate from the first line. The second semiconductor region is provided above the first semiconductor region in the first semiconductor layer. The third semiconductor region is provided above the second semiconductor region in the first semiconductor layer. The first gate insulating film covers a first side face of the first semiconductor layer. The first gate electrode covers the first side face of the first semiconductor layer through the first gate insulating film. The first transistor has an asymmetrical structure with respect to a center face of the second semiconductor region in the second direction.

11 Claims, 48 Drawing Sheets

Related U.S. Application Data

(60) Provisional application No. 61/949,060, filed on Mar. 6, 2014.

(51) Int. Cl.
- *H01L 29/423* (2006.01)
- *H01L 29/78* (2006.01)
- *H01L 45/00* (2006.01)

(52) U.S. Cl.
CPC .. *H01L 29/42368* (2013.01); *H01L 29/42376* (2013.01); *H01L 29/7827* (2013.01); *H01L 29/78642* (2013.01); *H01L 45/1226* (2013.01); *H01L 45/145* (2013.01); *H01L 45/146* (2013.01); *H01L 45/148* (2013.01); *H01L 45/149* (2013.01); *H01L 45/16* (2013.01)

(56) References Cited

U.S. PATENT DOCUMENTS

| | | | |
|---|---|---|---|
| 6,815,772 B2 | 11/2004 | Takemura | |
| 2005/0164455 A1 | 7/2005 | Jang et al. | |
| 2007/0218605 A1* | 9/2007 | Ozawa | H01L 21/28247 438/164 |
| 2012/0153379 A1* | 6/2012 | Kim | H01L 27/10876 257/329 |
| 2012/0161094 A1* | 6/2012 | Huo | H01L 27/249 257/4 |
| 2012/0182784 A1 | 7/2012 | Murooka | |
| 2012/0223380 A1 | 9/2012 | Lee | |
| 2013/0272069 A1* | 10/2013 | Rabkin | H01L 29/6675 365/185.17 |
| 2013/0292630 A1* | 11/2013 | Sasago | H01L 27/2454 257/4 |
| 2014/0252454 A1* | 9/2014 | Rabkin | H01L 27/249 257/329 |

FOREIGN PATENT DOCUMENTS

| | | |
|---|---|---|
| JP | 2008-153567 A | 7/2008 |
| JP | 2009-4517 A | 1/2009 |
| JP | 2011-181617 A | 9/2011 |
| JP | 2013-152964 A | 8/2013 |

* cited by examiner

C4

C4'

C17

C17'

SEMICONDUCTOR DEVICE

CROSS-REFERENCE TO RELATED APPLICATIONS

This application is a divisional of U.S. application Ser. No. 14/461,720, filed Aug. 18, 2014, and is based upon and claims the benefit of priority from prior U.S. Provisional Application No. 61/949,060, filed on Mar. 6, 2014, the entire contents of each of which are incorporated herein by reference.

FIELD

Embodiments described herein relate generally to a semiconductor device.

BACKGROUND

In a semiconductor device, when a gate induced drain leakage (GIDL) current occurs in a transistor in the OFF state, there is a possibility that current consumption of the semiconductor device increases. Therefore, it is desirable that the GIDL current be suppressed in the transistor.

DETAILED DESCRIPTION

In general, according to one embodiment, there is provided a semiconductor device including a first line and a first transistor. The first line is configured to extend in a first direction along a surface of a semiconductor substrate. The first transistor is configured to be disposed above the first line. The first transistor includes a first semiconductor region, a second semiconductor region, a third semiconductor region, a first gate insulating film, and a first gate electrode. The first semiconductor region is provided in a first semiconductor layer extending in a second direction substantially perpendicular to the surface of the semiconductor substrate from the first line. The second semiconductor region is provided above the first semiconductor region in the first semiconductor layer. The third semiconductor region is provided above the second semiconductor region in the first semiconductor layer. The first gate insulating film covers a first side face of the first semiconductor layer. The first gate electrode covers the first side face of the first semiconductor layer through the first gate insulating film. The first transistor has an asymmetrical structure with respect to a center face of the second semiconductor region in the second direction.

Exemplary embodiments of a semiconductor device will be explained below in detail with reference to the accompanying drawings. The present invention is not limited to the following embodiments.

First Embodiment

Figure 20A:
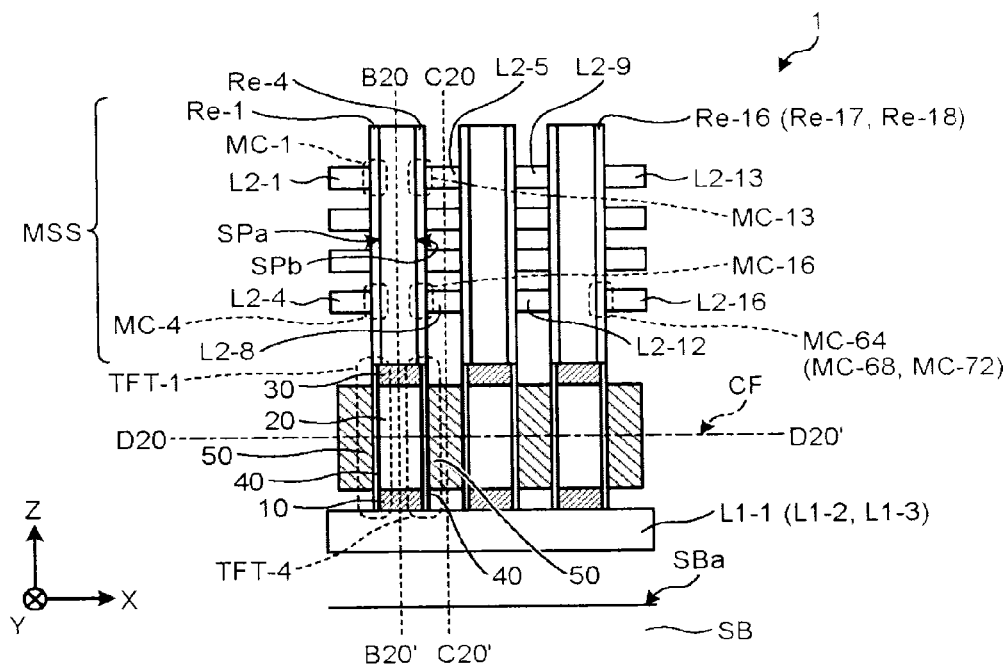
FIGS. 20A to 20D are diagrams illustrating cross-sectional structures and a plan structure of a semiconductor device according to a basic form.
Figure 20B:
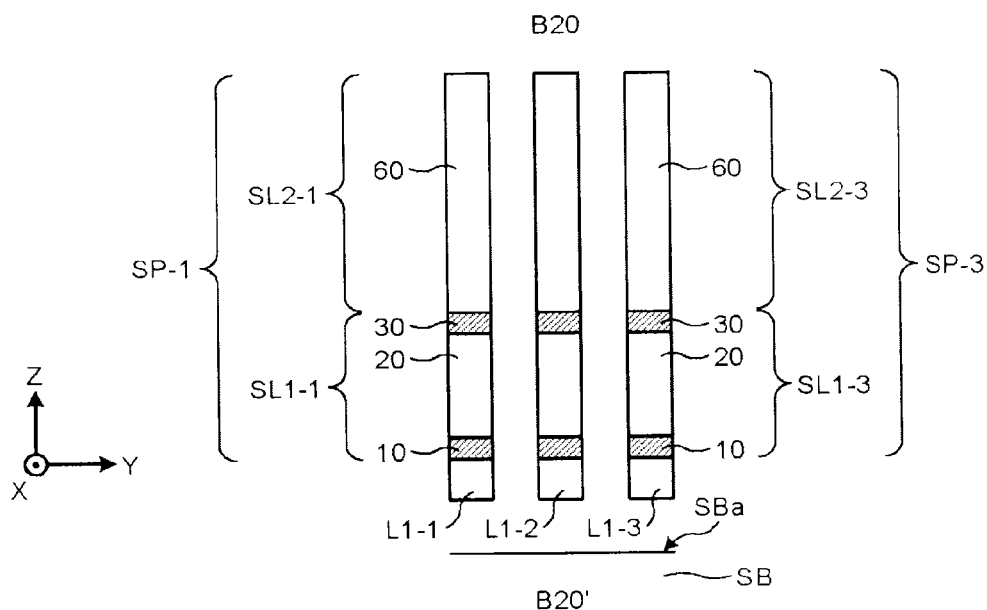
Figure 20C:
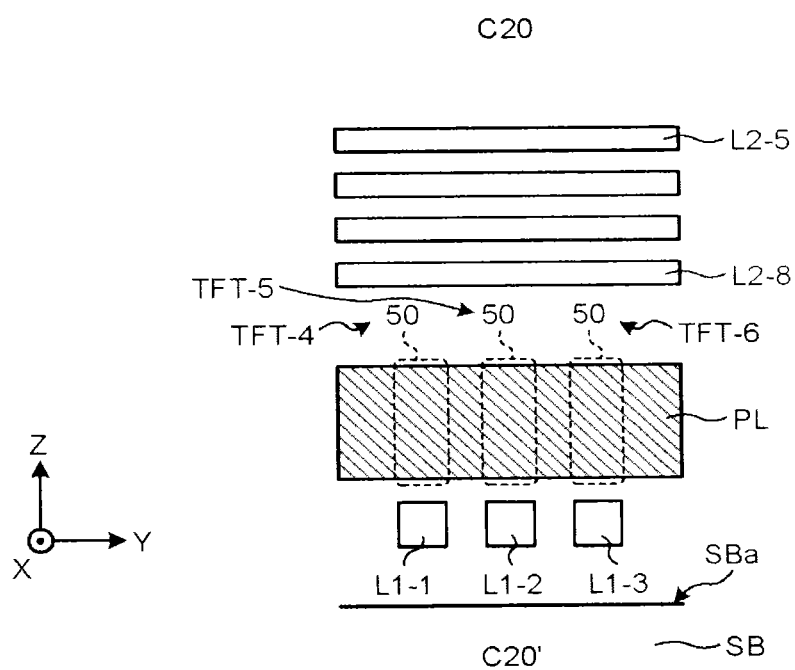
Figure 20D:
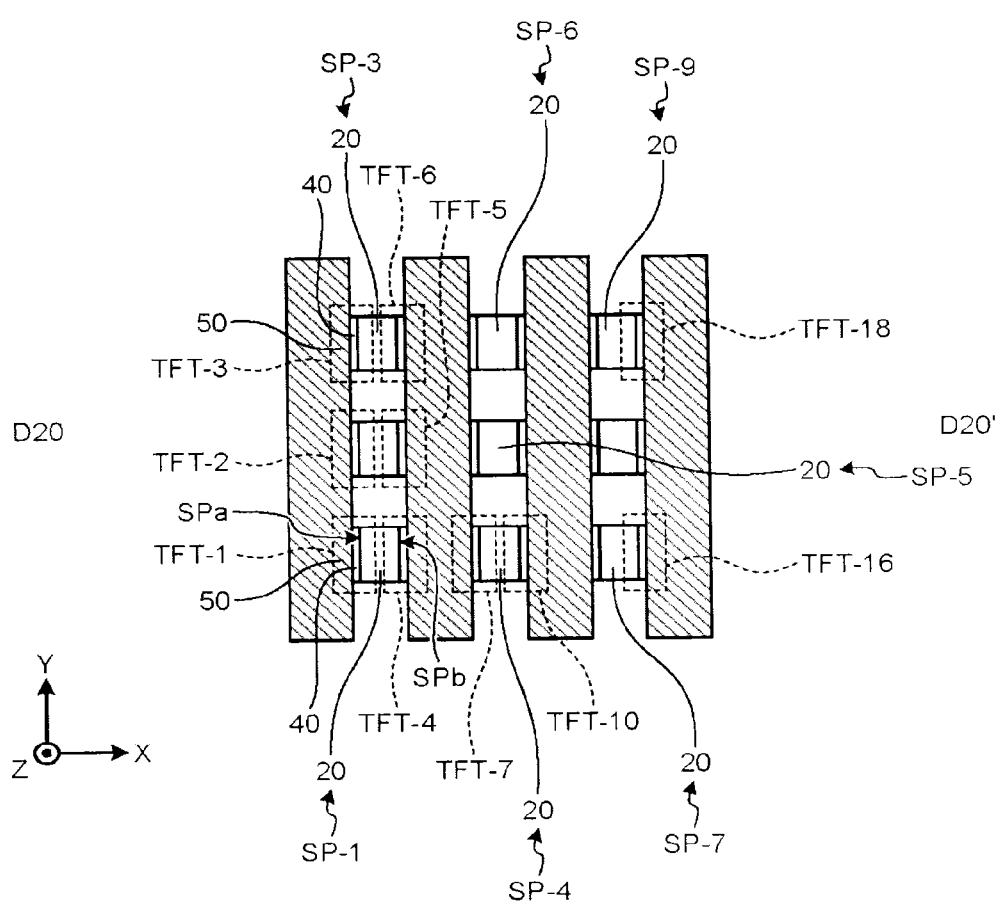

Before the description on a semiconductor device 100 according to a first embodiment is given, the structure of a semiconductor device 1 according to a comparative example will be first described using FIGS. 20A to 20D. FIG. 20A is a diagram illustrating a cross-sectional structure of the semiconductor device 1. FIG. 20B is a diagram illustrating a cross-sectional structure taken along line B20-B20' of FIG. 20A. FIG. 20C is a diagram illustrating a cross-sectional structure taken along line C20-C20' of FIG. 20A. FIG. 20D is a diagram illustrating a plan structure taken along line D20-D20' of FIG. 20A. In addition, an interlayer insulating film in a memory cell stacking section MSS will not be illustrated in FIG. 20A to 20C for convenience sake.

The semiconductor device 1, for example, is a nonvolatile semiconductor memory device having a three-dimensionally staked structure. The semiconductor device 1 includes a semiconductor substrate SB, a plurality of conductive lines (a plurality of first conductive lines) L1-1 to L1-3, a plurality of conductive lines (a plurality of second conductive lines) L2-1 to L2-16, a plurality of memory cells MC-1 to MC-72, and a plurality of thin film transistors TFT-1 to TFT-18. The semiconductor device 1, for example, is a resistance change type nonvolatile semiconductor memory device. Each of the memory cells MC-1 to MC-72, for example, includes a resistance change element.

The semiconductor substrate SB, for example, is formed of a semiconductor such as silicon. In the following, two directions intersecting each other on a plane substantially parallel with a surface SBa of the semiconductor substrate SB are defined as an X direction and a Y direction, and a direction substantially perpendicular to the surface SBa of the semiconductor substrate SB is defined as a Z direction. Further, a direction away from the surface SBa of the semiconductor substrate SB to the above is defined as a +Z direction, and a direction getting close to the surface SBa of the semiconductor substrate SB from the above is defined as a −Z direction.

The plurality of conductive lines L1-1 to L1-3 are disposed above the semiconductor substrate SB, and extend along the surface SBa of the semiconductor substrate SB. The conductive lines L1-1 to L1-3 each extend along the X direction (a first direction), and are arranged in the Y direction arranged next to each other (for example, substantially parallel with each other). Each of the conductive lines L1-1 to L1-3 functions as a global bit line GBL (see FIG. 21) in a case where the semiconductor device 1 is the nonvolatile semiconductor memory device.

Each of the plurality of thin film transistors TFT-1 to TFT-18 is disposed on a corresponding one of the conductive lines L1-1 to L1-3. Each of the thin film transistors TFT-1 to TFT-18 is a vertical type thin film transistor TFT.

Specifically, each thin film transistor TFT includes a semiconductor region 10, a semiconductor region 20, a semiconductor region 30, a gate insulating film 40, and a gate electrode 50.

The semiconductor region 10 is provided in a first semiconductor layer SL1 of a semiconductor pillar SP. The semiconductor pillar SP includes the first semiconductor layer SL1 and a second semiconductor layer SL2 which is disposed on the upper face of the first semiconductor layer SL1. The semiconductor region 10 can be provided right on the conductive line L1 in the first semiconductor layer SL1. The semiconductor region 10 contains a second conductivity type (for example, N type) of impurity. The second conductivity type is a conductivity type opposite to a first conductivity type. The N type of impurity, for example, is phosphorus or arsenic. The semiconductor region 10 functions as a drain or a source of the thin film transistor TFT.

The semiconductor region 20 is provided on the semiconductor region 10 in the first semiconductor layer SL1. The semiconductor region 20 contains no impurities or alternatively contains the first conductivity type (for example, P type) of impurity having a concentration lower than that of the second conductivity type of impurity in the semiconductor region 10. The semiconductor region 20 functions as a channel in the thin film transistor TFT.

The semiconductor region 30 is provided on the semiconductor region 20 in the first semiconductor layer SL1. The semiconductor region 30 contains the second conductivity type (for example, N type) of impurity. Alternatively, in a case where the semiconductor region 20 contains the second conductivity type of impurity, the semiconductor region 30 contains the first conductivity type of impurity having a concentration higher than that of the second conductivity type of impurity in the semiconductor region 20. It should be noted that in the former case the concentration of the second conductivity type of impurity in the semiconductor region 30 may be substantially equal to that of the second conductivity type of impurity in the semiconductor region 10. The semiconductor region 30 functions as a source or a drain of the thin film transistor TFT.

The gate insulating film 40 covers the side face of the first semiconductor layer SL1. The gate insulating film 40 can mainly cover a region in the side face of the first semiconductor layer SL1 corresponding to the semiconductor region 20. The gate insulating film 40 may further cover regions in the side face of the first semiconductor layer SL1 corresponding to the semiconductor regions 10 and 30.

The gate electrode 50 covers the side face of the first semiconductor layer SL1 through the gate insulating film 40. The gate electrode 50 can mainly cover a region in the side face of the first semiconductor layer SL1 corresponding to the semiconductor region 20 through the gate insulating film 40. As illustrated in FIG. 20C, the gate electrode 50 included in a member PL extending in the Y direction, which intersects with the first semiconductor layer SL1 in the Z direction. In other words, the gate electrodes 50 of the thin film transistors TFT which are adjacent in the Y direction are commonly connected to each other by the member PL.

Line D20-D20' of FIG. 20A also represents the center face CF of the semiconductor region 20 in the Z direction. Herein, the center face CF is a face at the center position within a range from the upper face of the semiconductor region 30 to the lower face of the semiconductor region 30 in the Z direction. Further, the center face CF can also be called a face at the center position within a range from the lower face of the second semiconductor layer SL2 to the upper face of the conductive line L1 in the Z direction. As illustrated in FIG. 20A, each thin film transistor TFT has a substantially symmetric structure to the center face CF.

Note that, the second semiconductor layers SL2-1 to SL2-9 of respective semiconductor pillars SP-1 to SP-9 function as local bit lines LBL (see FIG. 21) in a case where the semiconductor device 1 is the nonvolatile semiconductor memory device. A semiconductor region 60 in each of the second semiconductor layers SL2-1 to SL2-9 corresponding to resistance change films Re may contain the first conductivity type (for example, P type) of impurity. The P type of impurity, for example, is boron or aluminum. Alternatively, the second semiconductor layer SL2 may be formed of metal such as tungsten.

Herein, the resistance change film Re can be made of HfO. Alternatively, a polycrystal or amorphous Si, SiO, SiON, SiN, Ge, SiGe, GaAs, InP, GaP, GaInAsP, GaN, SiC, HfSiO, AlO, or the like can be used for the resistance change film Re. Alternatively, a staked film made of the above-mentioned material may be used as a resistance change member. Alternatively, an electrode may be formed with the resistance change film Re interposed therebetween. As the electrode, for example, an electrode made of Ag, Au, Ti, Ni, Co, Al, Fe, Cr, Cu, W, Hf, Ta, Pt, Ru, Zr, Ir, a nitride or a carbide thereof, or the like can be disposed. Alternatively, a material obtained by adding the above material to the polycrystal silicon may be used as the electrode. Alternatively, a TaSiN stopper layer may be inserted on a side opposite to the electrode of the resistance change material.

The plurality of conductive lines L2-1 to L2-16 are disposed above the semiconductor substrate SB, and extend along the surface SBa of the semiconductor substrate SB to intersect with the conductive lines L1-1 to L1-3 when viewed from the Z direction. The respective conductive lines L2-1 to L2-16 extend in the Y direction (a second direction), and arranged in the X direction arranged next to each other (for example, substantially parallel with each other). Each of the conductive lines L2-1 to L2-16 functions as a word line WL (see FIG. 21) in a case where the semiconductor device 1 is the nonvolatile semiconductor memory device.

The plurality of conductive lines L2-1 to L2-4 are disposed to be separated from each other in the Z direction. Further, the plurality of conductive lines L2-1 to L2-4 are disposed above the thin film transistors TFT-1 to TFT-3. The plurality of conductive lines L2-1 to L2-4 intersect with the semiconductor pillars SP-1 to SP-3 through the resistance change film Re above the thin film transistors TFT-1 to TFT-3, respectively. The semiconductor pillars SP-1 to SP-3 extend in the +Z direction from the corresponding conductive lines L1-1 to L1-3.

The plurality of conductive lines L2-5 to L2-8 are disposed above the thin film transistors TFT-4 to TFT-6 to be separated from each other in the Z direction. The plurality of conductive lines L2-5 to L2-8 intersect with the semiconductor pillars SP-1 to SP-3 through the resistance change film Re above the thin film transistors TFT-4 to TFT-6, respectively.

In other words, the plurality of conductive lines L2-1 to L2-4 and the plurality of conductive lines L2-5 to L2-8 intersect with the semiconductor pillars SP-1 to SP-3 respectively through the resistance change film Re on the opposite sides (both sides in the X direction).

Similarly, the plurality of conductive lines L2-5 to L2-8 and the plurality of conductive lines L2-9 to L2-12 intersect with the semiconductor pillars SP-4 to SP-6 through the resistance change film Re on the opposite sides (both sides in the X direction). The semiconductor pillars SP-4 to SP-6 extend in the +Z direction from the corresponding conductive lines L1-1 to L1-3, respectively. The semiconductor pillars SP-1 to SP-3 and the semiconductor pillars SP-4 to SP-6 are disposed on the opposite sides with the conductive lines L2-5 to L2-8 disposed therebetween.

The plurality of conductive lines L2-9 to L2-12 and the plurality of conductive lines L2-13 to L2-16 intersect with the semiconductor pillars SP-7 to SP-9 respectively through the resistance change film Re on the opposite sides (both sides in the X direction). The semiconductor pillars SP-7 to SP-9 extend in the +Z direction from the corresponding conductive lines L1-1 to L1-3, respectively. The semiconductor pillars SP-4 to SP-6 and the semiconductor pillars SP-7 to SP-9 are disposed on the opposite sides with the conductive lines L2-9 to L2-12 interposed therebetween.

The plurality of memory cells MC are disposed at positions in the resistance change films Re-1 to Re-18 where the semiconductor pillars SP-1 to SP-9 intersect with the conductive lines L2-1 to L2-16. The resistance change films Re-1 to Re-18 cover the side faces of the semiconductor pillars SP-1 to SP-9 above the gate insulating films 40 of the thin film transistors TFT-1 to TFT-18.

For example, the resistance change film Re-1 extends in the +Z direction above the thin film transistor TFT-1 along the side face SPa on the −X side of the semiconductor pillar SP-1, and the plurality of memory cells MC-1 to MC-4 are disposed at positions in the resistance change film Re-1 intersecting with the plurality of conductive lines L2-1 to L2-4. The resistance change film Re-4 extends in the +Z direction above the thin film transistor TFT-4 along the side face SPb on the +X side of the semiconductor pillar SP-1, and the plurality of memory cells MC-13 to MC-16 are disposed at positions in the resistance change film Re-4 intersecting with the plurality of conductive lines L2-5 to L2-8. In other words, the plurality of memory cells MC-1 to MC-4 and MC-13 to MC-16 are disposed corresponding to the semiconductor pillar SP-1 (a local bit line LBL-1), and correspond to the thin film transistors TFT-1 and TFT-4.

Figure 21:
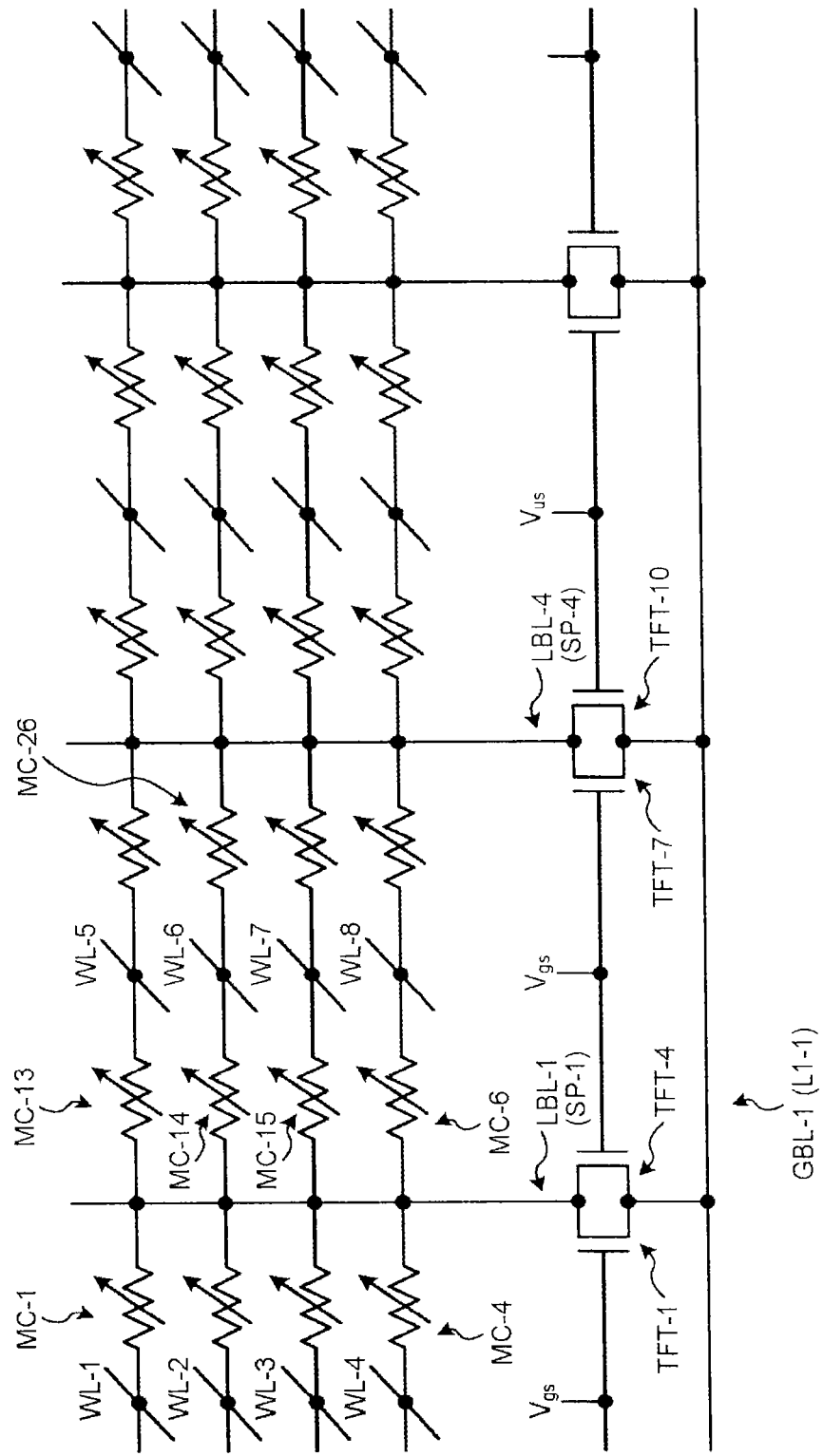
FIG. 21 is a diagram illustrating a circuit structure of a semiconductor device according to a comparative example.
Figure 22A:
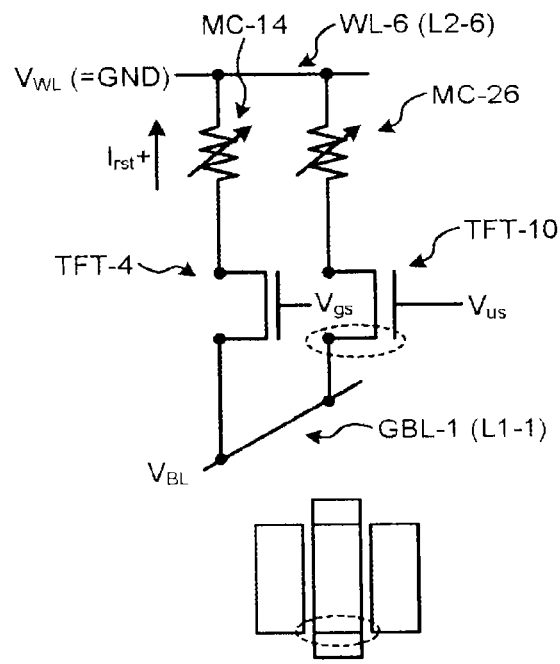
FIG. 22A is a diagram illustrating a GIDL current occurrence portion in a case where a memory cell is reset from a low resistance state to a high resistance state by making the voltage of a bit line higher than that of a word line.

Next, the operation of the semiconductor device 1 according to the comparative example will be described using FIGS. 21 and 22A. FIG. 21 is a diagram illustrating an equivalent circuit corresponding to the cross-sectional structure illustrated in FIG. 20A. FIG. 22A is a diagram illustrating a GIDL current occurrence portion in a case where a memory cell is reset from a low resistance state to a high resistance state by making the voltage of a bit line higher than that of a word line.

In the semiconductor device 1, two thin film transistors are disposed on both side faces of each of the semiconductor pillars SP-1 to SP-9 in the X direction. When being turned on, the two thin film transistors disposed in the both side faces of the semiconductor pillar SP select the semiconductor pillar SP (the local bit line LBL), and make any one of the plurality of memory cells MC connected to the semiconductor pillar SP enter a selectable state. For example, when being turned on, the thin film transistors TFT-1 and TFT-4 select the semiconductor pillar SP-1 to make any one of the plurality of memory cells MC-1 to MC-4 and MC-13 to MC-16 corresponding to the semiconductor pillar SP-1 enter the selectable state. In other words, as illustrated in FIG. 21, a control circuit (not illustrated) turns on the thin film transistors TFT-1 and TFT-4 to select the local bit line LBL-1 and makes any one of the plurality of memory cells MC-1 to MC-4 and MC-13 to MC-16 connected to the local bit line LBL-1 enter the selectable state.

For example, in a case where the memory cell MC-14 is selected for resetting and the other memory cells MC-1 to MC-13 and MC-15 to MC-72 are unselected, the control circuit causes the potential of a word line WL-6 (the conductive line L2-6) to become a selection potential GND (for example, 0 V), the potential of a global bit line GBL-1 to become a selection potential Vds (for example, 2 V or 2.7 V). At the same time, the control circuit supplies a selection potential Vgs to the gate electrodes of the thin film transistors TFT-1 and TFT-4 in order to select the local bit line LBL-1 (the semiconductor pillar SP-1). Therefore, the thin film transistors TFT-1 and TFT-4 are turned on.

On the other hand, the control circuit causes the potentials of the other word lines WL-1 to WL-5, WL-7, and WL-8 connected to the local bit line LBL-1 to be the nonselection potential Vds, and makes the other local bit lines connected to the global bit line GBL-1 enter an unselected state. For example, the control circuit supplies the nonselection potential Vus (for example, 0 V) to the gate electrode of the thin film transistor TFT-10 in order to make a local bit line LBL-4 (the semiconductor pillar SP-4) enter the unselected state. Therefore, the thin film transistor TFT-10 is turned off.

It should be noted that, since the control circuit supplies the selection potential Vgs to the gate electrode of the thin film transistor TFT-7, the thin film transistor TFT-7 is turned on. However, since the thin film transistor TFT-10 is turned off, the local bit line LBL-4 becomes a semi-selected state. As a result, a potential difference between the word line WL-6 and the local bit line LBL-4 does not increase as large as the resistance state of the memory cell MC-26 is changed. Therefore, the local bit line LBL-4 can be considered as in a substantially unselected state.

At this time, the unselected thin film transistor TFT-10 is controlled to enter the OFF state as illustrated in FIG. 22A, but the potential Vds (for example, 2 V or 2.7 V) of the global bit line GBL-1 on the drain side becomes high compared to the potential GND (for example, 0 V) of the word line WL-6 (the second conductive line L2-6) on the source side. Therefore, the unselected thin film transistor TFT-10 in the OFF state is easily applied with electric field between the source and the drain. Further, in the unselected thin film transistor TFT-10, the potential Vds (for example, 2 V or 2.7 V) of the global bit line GBL-1 on the drain side becomes high compared to the potential Vus (for example, 0 V or a negative voltage) of the gate electrode. Therefore, the unselected thin film transistor TFT-10 in the OFF state is easily applied with electric field between the gate and the drain. Therefore, in the unselected thin film transistor TFT-10, a GIDL (Gate Induced Drain Leakage) current is easily generated in the lower portion of the channel as illustrated with the broken line in FIG. 22A. When the GIDL current is generated in the unselected thin film transistor TFT, there is a possibility of increasing the current consumption of the semiconductor device 1. Further, when the GIDL current is generated in the unselected thin film transistor TFT, there is a possibility that a reset current Irst+ to flow into the memory cell MC-14 selected by the control circuit (not illustrated) is insufficient for the level required for resetting the memory cell from the low resistance state to the high resistance state.

Thus, in the first embodiment, the semiconductor device 100 is configured to include a thin film transistor TFT100 which has an asymmetrical structure with respect to the center face CF, so that it is possible to suppress the GIDL current from being generated in the lower portion of the channel when the thin film transistor TFT100 is in the OFF state.

Figure 1A:
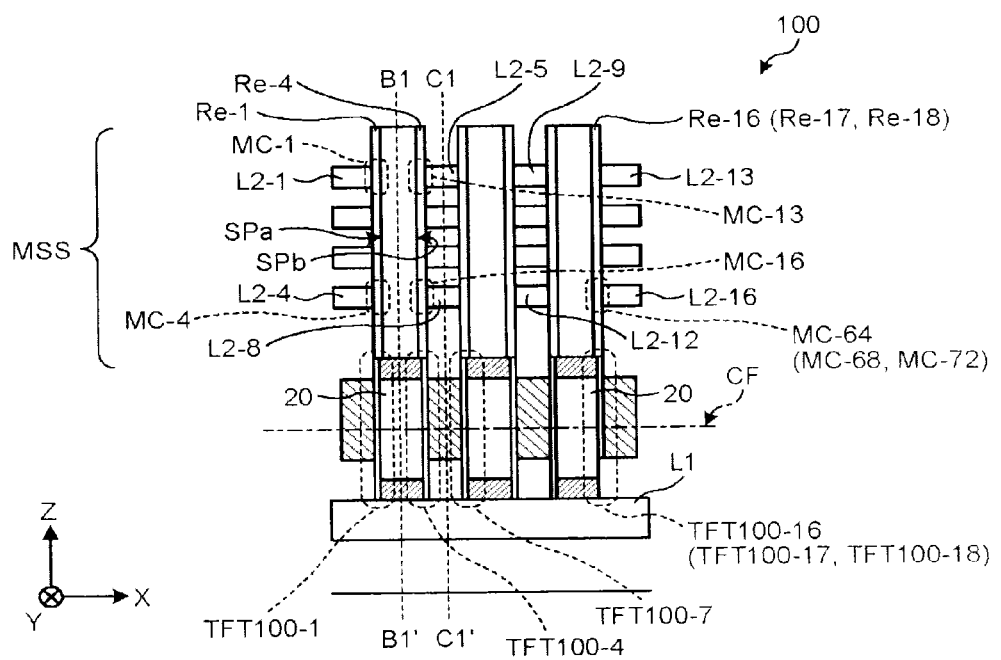
FIGS. 1A to 1F are diagrams illustrating cross-sectional structures and a perspective structure of a semiconductor device according to a first embodiment.
Figure 1B:
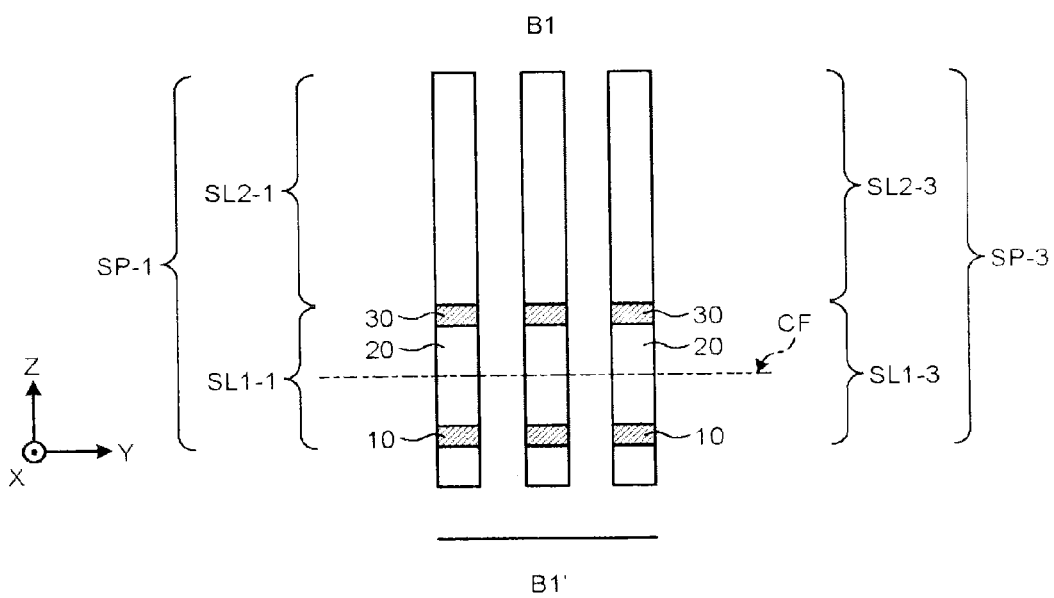
Figure 1C:
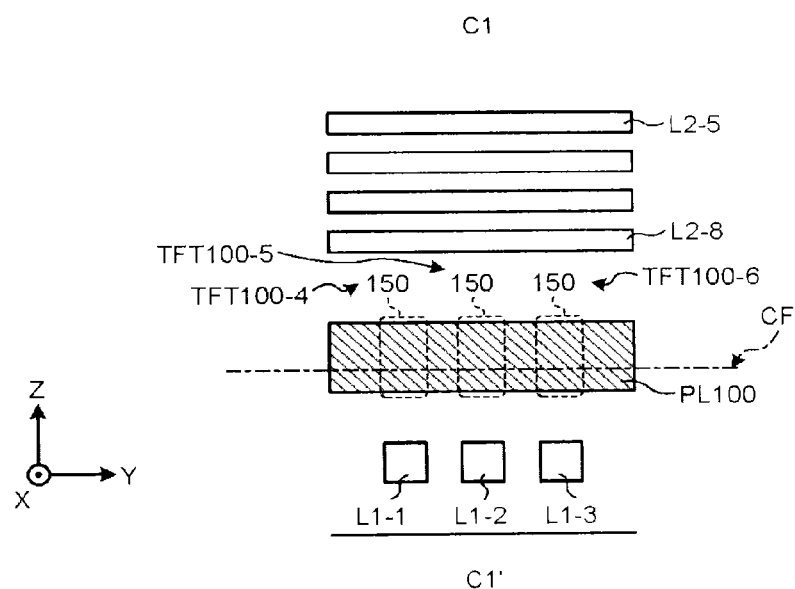
Figure 1D:
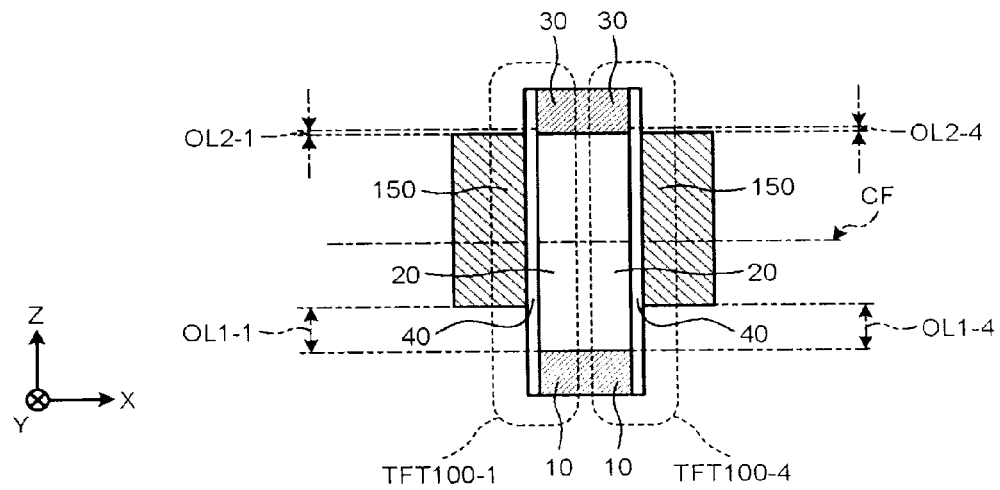
Figure 1E:
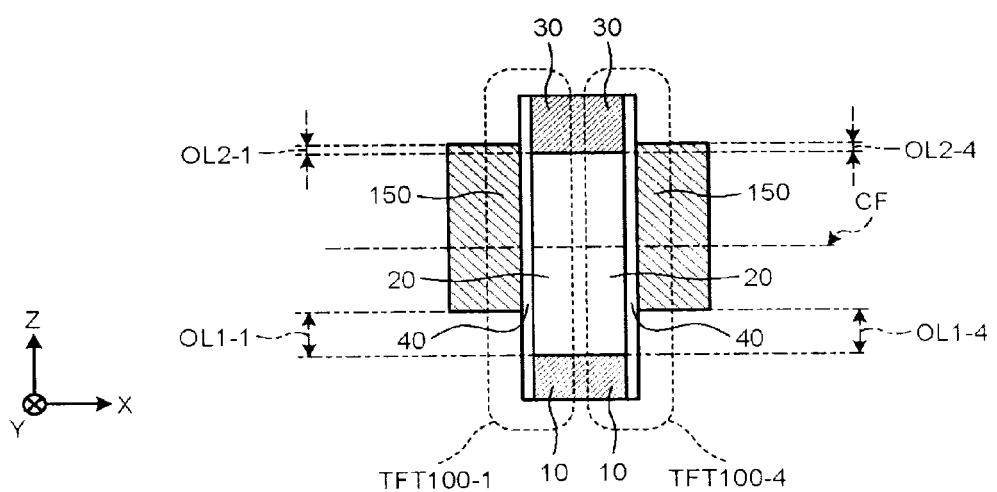
Figure 1F:
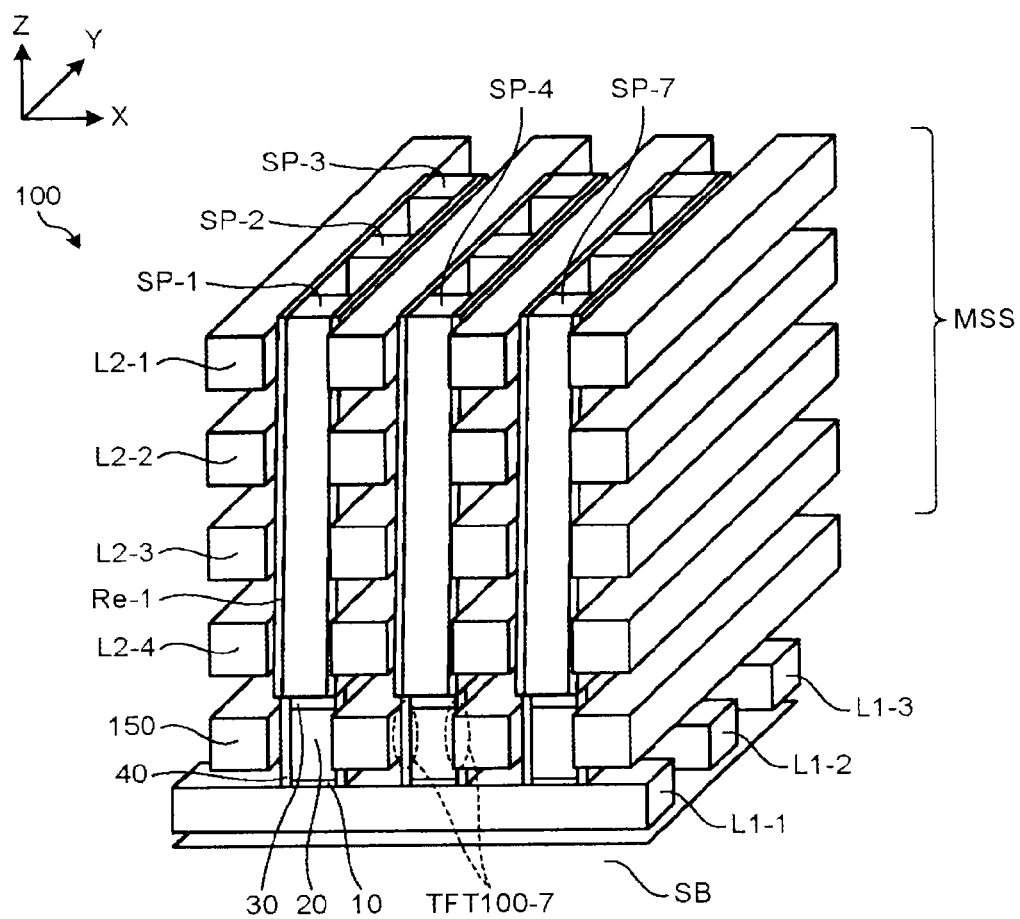

Specifically, the semiconductor device 100 includes a plurality of thin film transistors TFT100-1 to TFT100-18 as illustrated in FIGS. 1A to 1C and FIG. 1F. FIG. 1F is a perspective view illustrating the semiconductor device 100. FIG. 1A is a diagram illustrating a cross-sectional structure of the semiconductor device 100. FIG. 1B is a diagram illustrating a cross section taken along line B1-B1' of the structure in FIG. 1A. FIG. 1C is a diagram illustrating a cross section taken along line C1-C1' of the structure in FIG. 1A. In addition, the interlayer insulating film of the memory cell stacking section MSS is not illustrated in FIGS. 1A to 1C and FIG. 1F for convenience sake. Further, the cross-sectional view taken along line CF of FIG. 1A is substantially the same as that of FIG. 20D.

Each thin film transistor TFT100 has the asymmetrical structure with respect to the center face CF of the semiconductor region 20 in the Z direction. In a case where each memory cell MC is configured to be reset from the low resistance state to the high resistance state by making the voltage of the conductive line L1 (bit line) higher than that of the conductive line L2 (word line), it is desirable to weaken the electric field applied on the side of the semiconductor region 10 of each thin film transistor TFT100 in the OFF state (see FIG. 22A). Therefore, each thin film transistor TFT100 has the asymmetrical structure with respect to the center face CF so as to weaken the electric field applied on the side of the semiconductor region 10 in the OFF state.

In other words, each thin film transistor TFT100 is configured to have an overlap length between a gate electrode 150 and the semiconductor region 10 in the Z direction which is made different from an overlap length between the gate electrode 150 and the semiconductor region 30 in the Z direction in order to weaken the electric field applied on the side of the semiconductor region 10 (where a high voltage is applied) in the OFF state. Herein, the overlap length is a length over which the gate electrode 150 and the semiconductor region 10 or 30 overlap each other in the Z direction. Further, in a case where the gate electrode 150 and the semiconductor region 10 or 30 do not overlap each other in the Z direction, the overlap length will be represented by a negative value of the length between the end of the gate electrode 150 and the end of the semiconductor region 10 or 30.

For example, as illustrated in FIG. 1D, the thin film transistor TFT100-1 is configured such that an overlap length OL1-1 between the gate electrode 150 and the semiconductor region 10 in the Z direction is made smaller than an overlap length OL2-1 between the gate electrode 150 and the semiconductor region 30 in the Z direction. Otherwise, the gate electrode 150 and the semiconductor region 10 are separated in the Z direction, and the gate electrode 150 and the semiconductor region 10 do not overlap. FIG. 1D is a cross-sectional view illustrating the vicinity of the thin film transistor in the structure of FIG. 1A on a magnified scale. For example, in the case illustrated in FIG. 1D, the gate electrode 150 and the semiconductor region 10 are separated. Herein, the overlap length OL1-1 is less than zero (OL1-1<0). On the other hand, since the boundary of the gate electrode 150 and the boundary of the semiconductor region 30 are at substantially the same position, the overlap length OL2-1 becomes substantially zero (OL2-1≅0). Therefore, a relation of OL1-1<OL2-1 is established. Alternatively, the gate electrode 150 and the semiconductor region 30 may be overlapped in the Z direction as illustrated in FIG. 1E. Further, the gate electrode 150 and the semiconductor region 30 may be slightly separated in the Z direction as illustrated in FIG. 1D.

Similarly, as illustrated in FIG. 1D, the thin film transistor TFT100-4 is configured such that an overlap length OL1-4 between the gate electrode 150 and the semiconductor region 10 in the Z direction is made smaller than an overlap length OL2-4 between the gate electrode 150 and the semiconductor region 30 in the Z direction. For example, in the case illustrated in FIG. 1D, a relation of OL1-4<OL2-4 is established.

It should be noted that, such an asymmetrical structure of the thin film transistor TFT100-1 illustrated in FIG. 1D is also similar to those of the thin film transistors TFT100-5 and TFT100-6 which are disposed in the Y direction as illustrated in FIG. 1C. Therefore, the electric field applied on the side of the semiconductor region 10 in the OFF state can be weakened in each thin film transistor TFT100. As a result, in a case where the thin film transistor TFT100 is unselected when a predetermined memory cell is selected and reset from the low resistance state to the high resistance state, the GIDL current in the thin film transistor TFT100 can be suppressed.

Further, in each thin film transistor TFT100, in a case where each memory cell MC is set from the high resistance state to the low resistance state by making the voltage of the conductive line L2 (word line) higher than that of the conductive line L1 (bit line), a length of the overlapping region between the semiconductor region 30 serving as the drain and the gate electrode 150 in the Z direction is substantially zero or equal to or longer than zero. With this configuration, it is possible to easily secure a drain current in the ON state of the thin film transistor TFT100 corresponding to the memory cell MC to be set. Therefore, it is possible to easily secure a set current Iset− required for flowing into the memory cell MC as high a level as the memory cell can be set from the high resistance state to the low resistance state.

It should be also noted that, since an absolute value of the set current Iset− as a current required for flowing into the memory cell MC tends to be small compared to an absolute value of the reset Irst+, the GIDL current of the unselected thin film transistor at the time of the set operation is difficult to pose a problem compared to the GIDL current of the unselected thin film transistor at the time of the reset operation.

Next, a method of manufacturing the semiconductor device 100 will be described using FIGS. 2A to 9C. FIGS.

2A to 9C are cross-sectional views illustrating procedures in the method of manufacturing the semiconductor device 100.

Figure 2A:
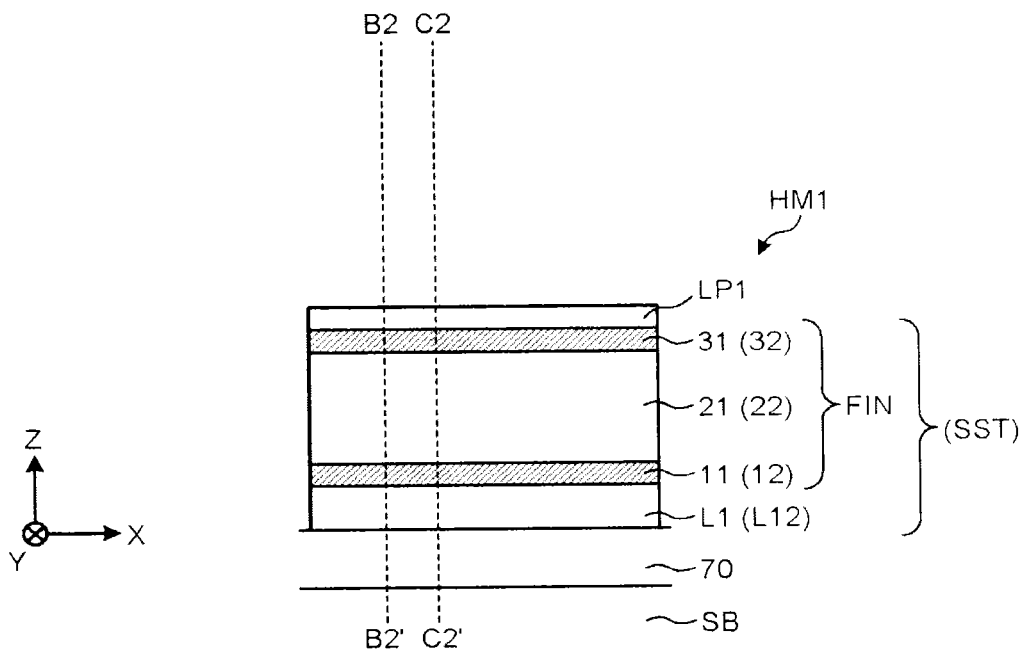
FIGS. 2A to 9C are diagrams illustrating a method of manufacturing the semiconductor device according to the first embodiment.
Figure 2B:
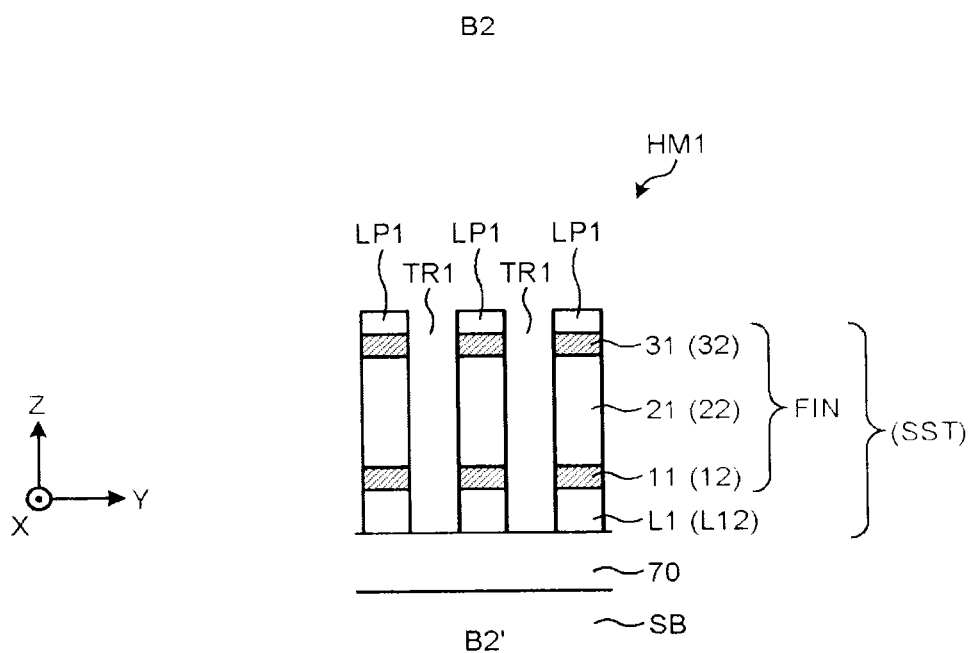
Figure 2C:
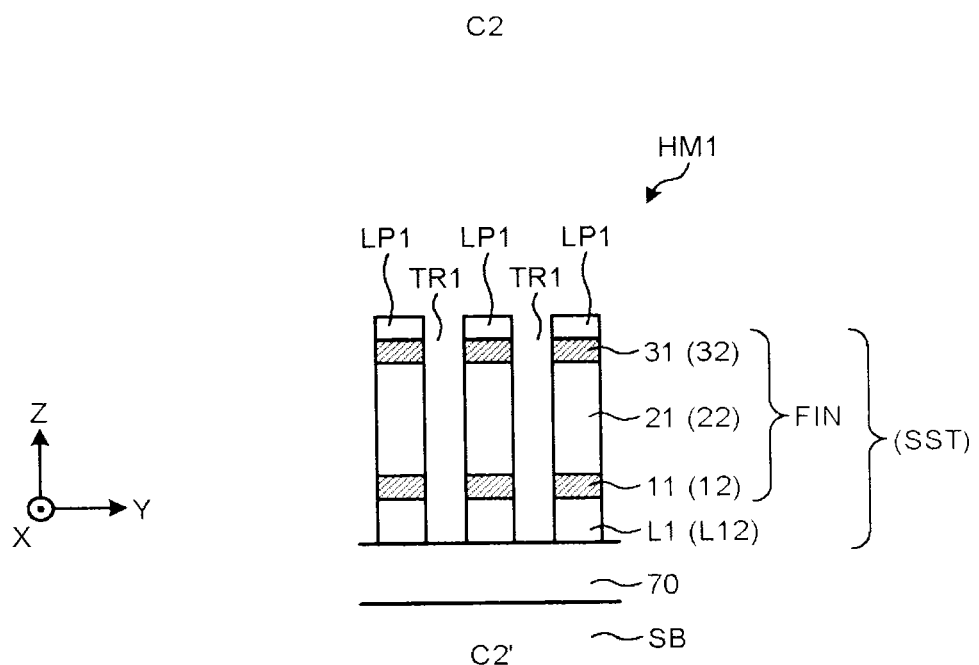

In the procedures illustrated in FIGS. 2A to 2C, an interlayer insulating film 70, a conductive film L12, a semiconductor film 12, a semiconductor film 22, and a semiconductor film 32 are layered on the semiconductor substrate SB in this order. FIG. 2A is a cross-sectional view illustrating the procedures. FIG. 2B is a diagram illustrating a cross section taken along line B2-B2' of the structure in FIG. 2A. FIG. 2C is a diagram illustrating a cross section taken along line C2-C2' of the structure in FIG. 2A.

The interlayer insulating film 70, for example, is formed of a material having a silicon oxide as a main component thereof. The conductive film L12, for example, is formed of a material having a metal (for example, aluminum) as a main component thereof. The semiconductor film 12 is formed of a material having a semiconductor (for example, silicon) as a main component thereof containing the second conductivity type (for example, N type) of impurity. The N type of impurity, for example, is phosphorus or arsenic. The semiconductor film 22 is formed of a material having a semiconductor (for example, silicon) as a main component thereof which contains no impurities or alternatively contains the first conductivity type (for example, P type) of impurity having a concentration lower than that of the second conductivity type of impurity in the semiconductor film 12. The P type of impurity, for example, is boron or aluminum. The semiconductor film 32 is formed of a material having a semiconductor (for example, silicon) as a main component thereof which contains the second conductivity type of impurity having a concentration higher than that of the first conductivity type of impurity in the semiconductor film 22. In addition, the semiconductor film 12 and the semiconductor film 32 may be formed such that a concentration of the second conductivity type of impurity in the semiconductor film 32 is substantially equal to that of the second conductivity type of impurity in the semiconductor film 12. The interlayer insulating film 70, the conductive film L12, the semiconductor film 12, the semiconductor film 22, and the semiconductor film 32 each can be deposited by a CVD method or a sputtering method. Therefore, a stack structure SST in which the conductive film L12, the semiconductor film 12, the semiconductor film 22, and the semiconductor film 32 are layered is formed on the semiconductor substrate SB.

Next, a hard mask HM1 is formed on the stack structure SST by photolithography. The hard mask HM1 includes a plurality of line patterns LP1, each of which extends in the X direction. The hard mask HM1, for example, is formed of a material having a silicon nitride as a main component thereof. Anisotropic etching is performed by an RIE method using the hard mask HM1 as a mask until the surface of the interlayer insulating film 70 is exposed. Therefore, the plurality of line patterns LP1 of the hard mask HM1 are transferred onto the stack structure SST. The stack structure SST is divided by a plurality of grooves TR1, each of which extends in the X direction, and thus a plurality of conductive lines L1 and a plurality of fin layers FIN are formed. Each of the plurality of conductive lines L1 extends in the X direction. Each of the plurality of fin layers FIN is formed on the corresponding conductive line L1, protrudes in the Z direction, and extends in the X direction. In each fin layer FIN, a semiconductor layer 11, a semiconductor layer 21, and a semiconductor layer 31 are layered on the conductive line L1.

Figure 3A:
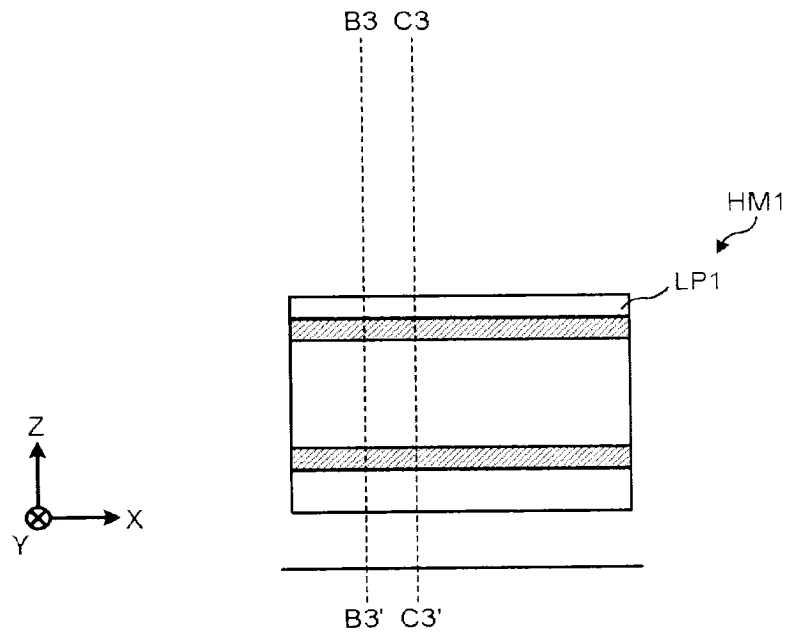
Figure 3B:
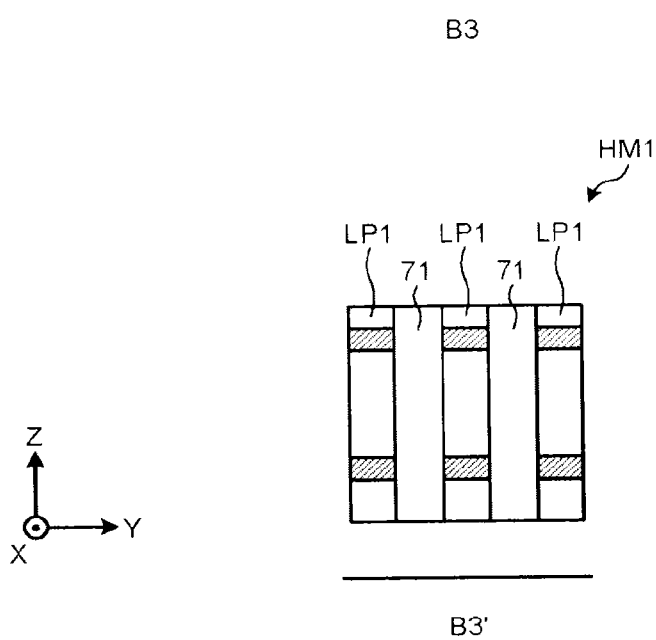
Figure 3C:
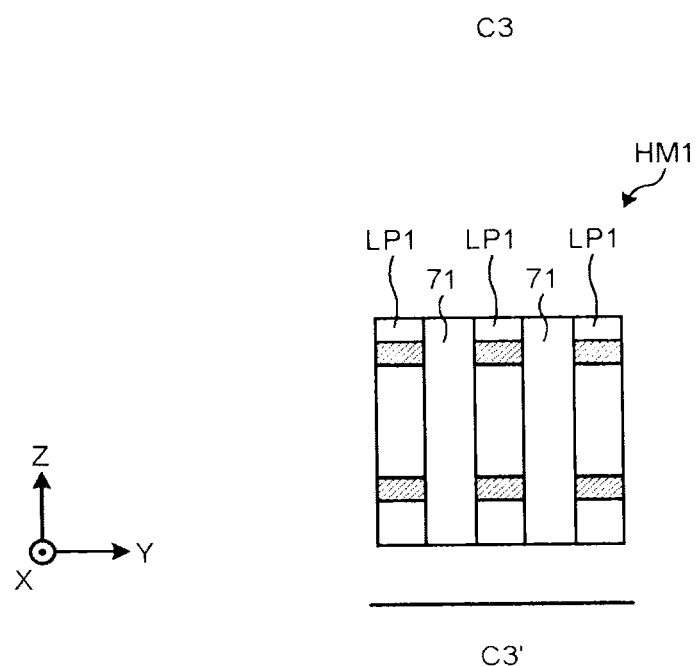

In the procedures illustrated in FIGS. 3A to 3C, the plurality of grooves TR1 (see FIG. 2B) are filled with an interlayer insulating film 71. FIG. 3A is a cross-sectional view illustrating the procedures. FIG. 3B is a diagram illustrating a cross section taken along line B3-B3' of the structure in FIG. 3A. FIG. 3C is a diagram illustrating a cross section taken along line C3-C3' of the structure in FIG. 3A.

For example, the interlayer insulating film 71 is deposited over the entire surface by the CVD method. Then, the upper face of the interlayer insulating film 71 is planarized by the CMP method using the hard mask HM1 as a stopper.

Figure 4A:
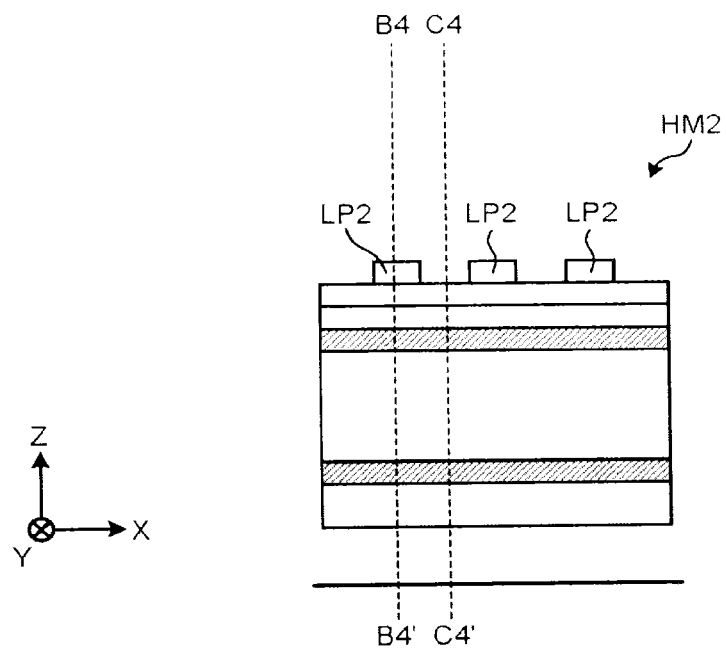
Figure 4B:
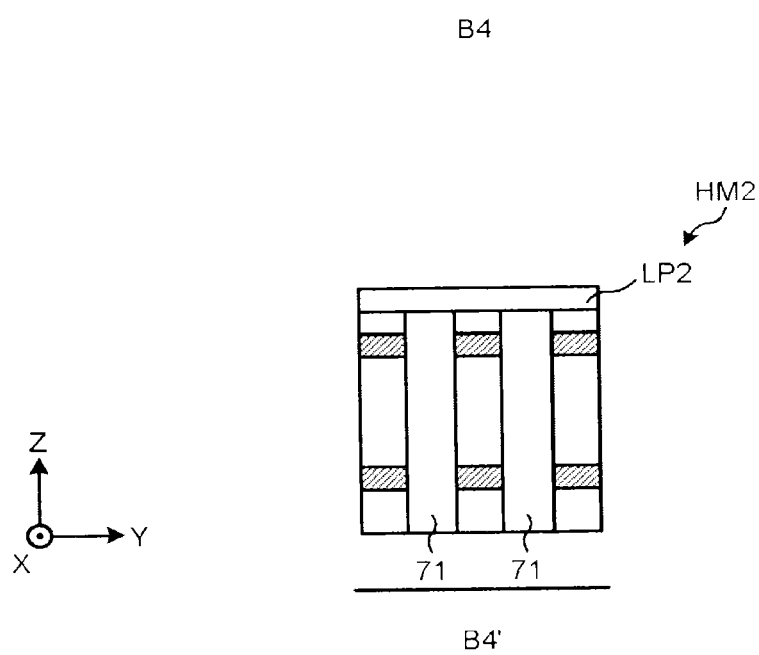
Figure 4C:
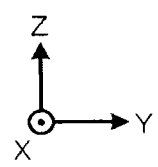
Figure 4C:
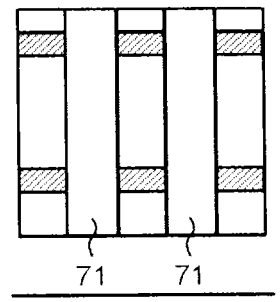

In the procedures illustrated in FIGS. 4A to 4C, a hard mask HM2 is formed on the plurality of fin layers FIN. FIG. 4A is a cross-sectional view illustrating the procedures. FIG. 4B is a diagram illustrating a cross section taken along line B4-B4' of the structure in FIG. 4A. FIG. 4C is a diagram illustrating a cross section taken along line C4-C4' of the structure in FIG. 4A.

The hard mask HM2 includes a plurality of line patterns LP2, each of which extends in the Y direction. The hard mask HM2, for example, is formed of a material having a silicon nitride as a main component thereof. When seen in perspective from the Z direction, the plurality of line patterns LP2 intersect with the plurality of line patterns L1 (for example, at right angle).

Figure 5A:
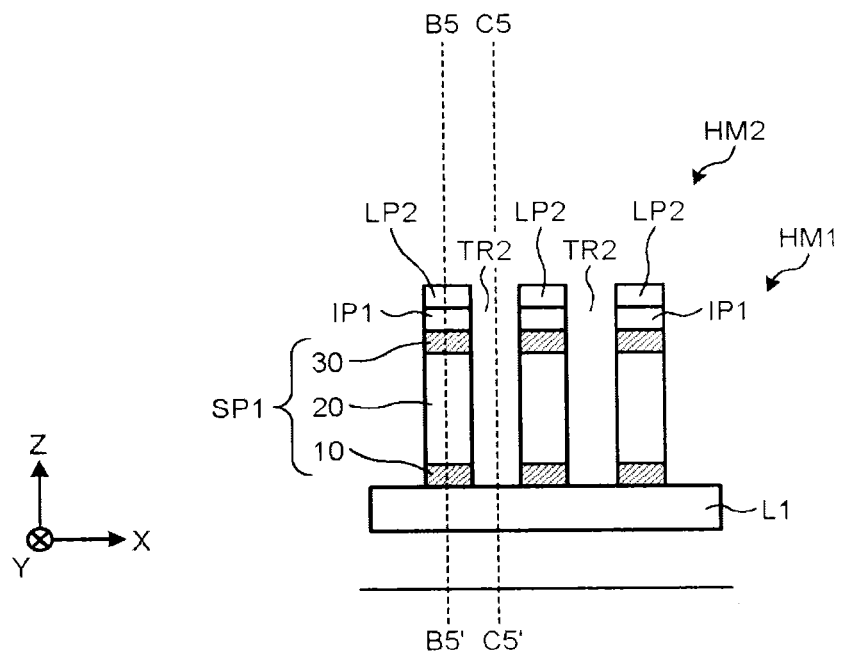
Figure 5B:
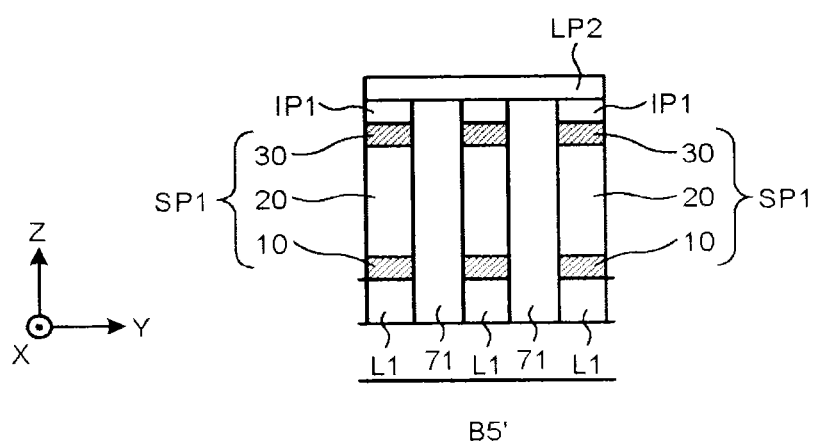
Figure 5C:
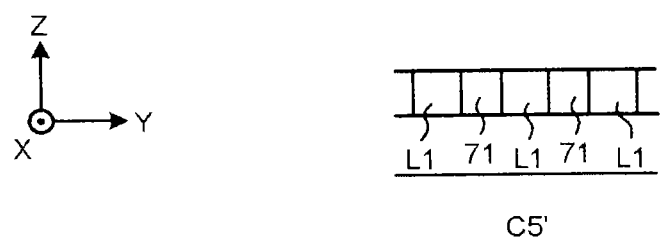

In the procedures illustrated in FIGS. 5A to 5C, the anisotropic etching is performed by the RIE method using the hard mask HM2 as a mask until the surface of the conductive line L1 is exposed. FIG. 5A is a cross-sectional view illustrating the procedures. FIG. 5B is a diagram illustrating a cross section taken along line B5-B5' of the structure in FIG. 5A. FIG. 5C is a diagram illustrating a cross section taken along line C5-05' of the structure in FIG. 5A.

Through the anisotropic etching, the plurality of line patterns LP2 of the hard mask HM2 are sequentially transferred onto the hard mask HM1 and the plurality of fin layers FIN. In other words, the hard mask HM1 is divided by a plurality of grooves TR2, each of which extends in the Y direction, and thus a plurality of island patterns IP1 are formed. Then, the plurality of fin layers FIN are divided by the plurality of grooves TR2, each of which extends in the Y direction, and thus a plurality of semiconductor pillars SP1 are formed. Each of the plurality of conductive lines L1 extends in the X direction. Each of the plurality of semiconductor pillars SP1 is formed on the conductive line L1, and extends in the Z direction. In each semiconductor pillar SP1, the semiconductor region 10, the semiconductor region 20, and the semiconductor region 30 are layered on the conductive line L1 in this order.

Figure 6A:
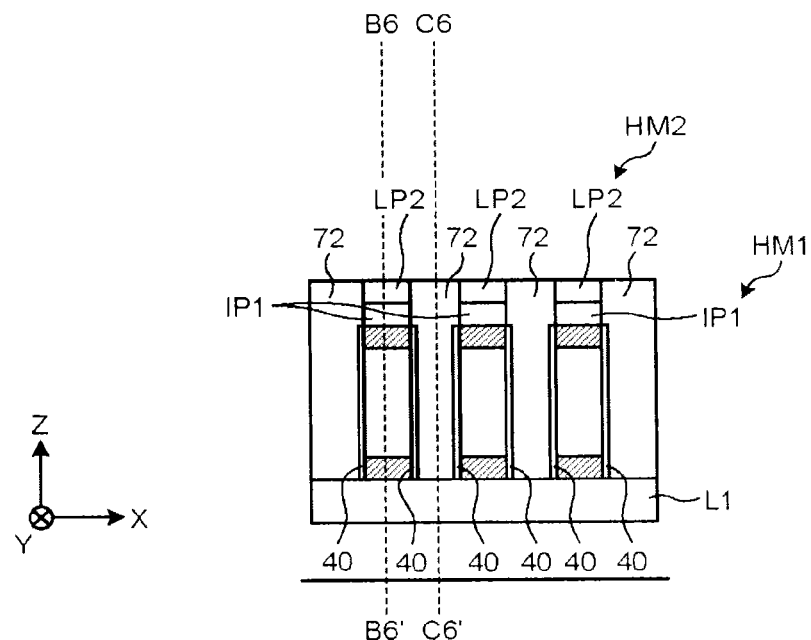
Figure 6B:
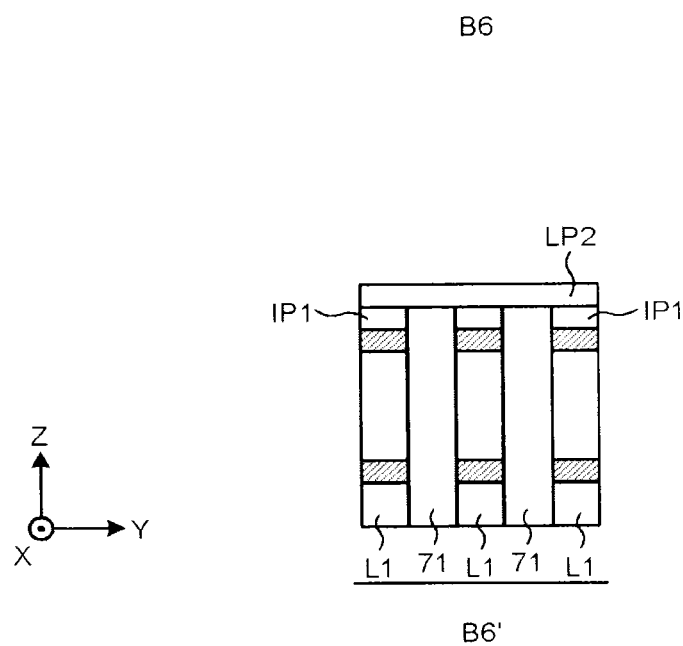
Figure 6C:
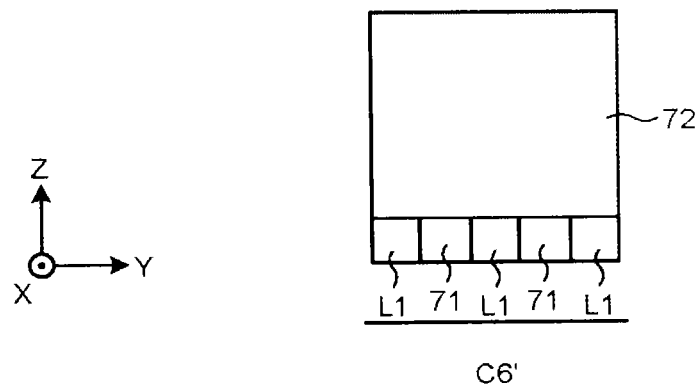

In the procedures illustrated in FIGS. 6A to 6C, the exposed side faces of each of the plurality of semiconductor pillars SP1 are oxidized by a thermal oxidation method to form gate oxide films 40. FIG. 6A is a cross-sectional view illustrating the procedures. FIG. 6B is a diagram illustrating a cross section taken along line B6-B6' of the structure in FIG. 6A. FIG. 6C is a diagram illustrating a cross section taken along line C6-C6' of the structure in FIG. 6A.

Then, the plurality of grooves TR2 (see FIG. 5A) are filled with an interlayer insulating film 72. For example, the interlayer insulating film 72 is deposited over the entire surface by the CVD method. Then, the upper face of the interlayer insulating film 72 is planarized using the hard mask HM2 as a stopper.

Figure 7A:
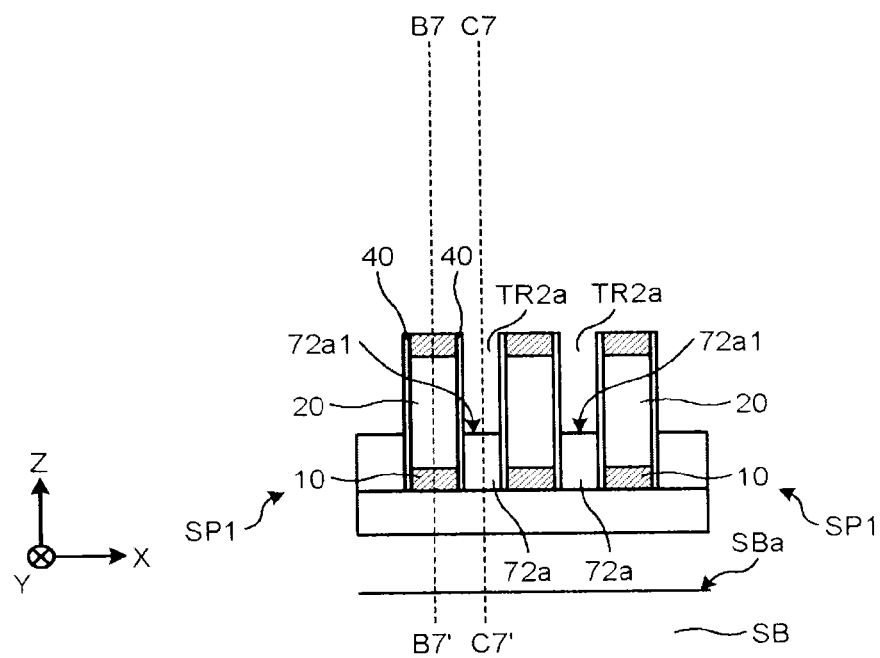
Figure 7B:
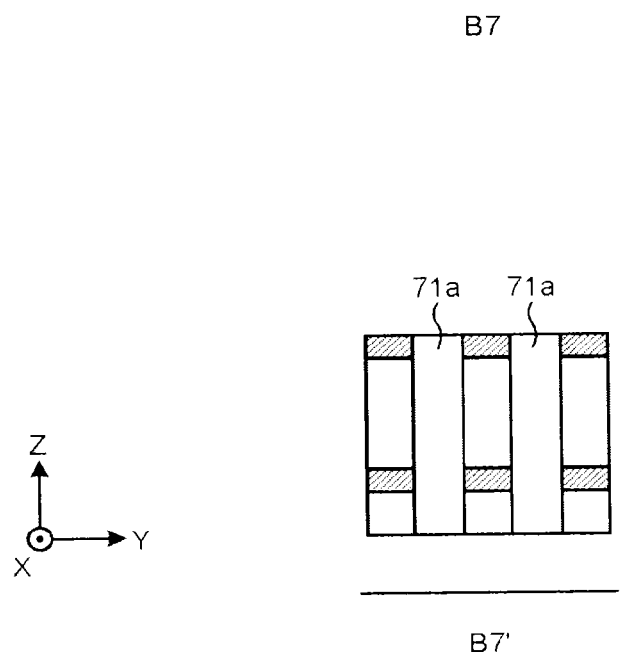
Figure 7C:
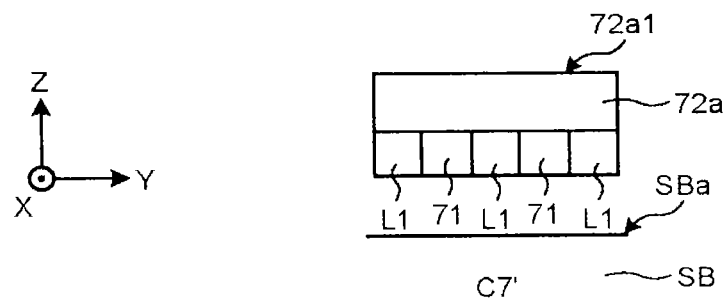

In the procedures illustrated in FIGS. 7A to 7C, the interlayer insulating film 72 which fills the plurality of grooves TR2 (see FIG. 5A) is partially removed by the RIE method using the hard mask HM2 (see FIG. 6A) as a mask.

FIG. 7A is a cross-sectional view illustrating the procedures. FIG. 7B is a diagram illustrating a cross section taken along line B7-B7' of the structure in FIG. 7A. FIG. 7C is a diagram illustrating a cross section taken along line C7-C7' of the structure in FIG. 7A.

At this time, the interlayer insulating film 72 (see FIG. 6A) is partially removed under etching conditions such that an interlayer insulating film 72a is left in a plurality of grooves TR2a while the gate insulating films 40 are left in the side faces of the plurality of semiconductor pillars SP1. For example, the etching period is adjusted such that the upper face 72a1 of the interlayer insulating film 72a left in the groove TR2a becomes higher than the boundary face between the semiconductor region 10 and the semiconductor region 20 in the semiconductor pillar SP1 from the surface SBa of the semiconductor substrate SB. Therefore, the bottom of each groove TR2a becomes higher than the boundary face between the semiconductor region 10 and the semiconductor region 20 in the semiconductor pillar SP1 from the surface SBa of the semiconductor substrate SB.

It should be noted that, when the interlayer insulating film 72 is etched, the hard masks HM1 and HM2 (see FIG. 6A) may be removed by the etching. In a case where the hard masks HM1 and HM2 are left, the left hard masks HM1 and HM2 are removed by the CMP or wet etching method.

Figure 8A:
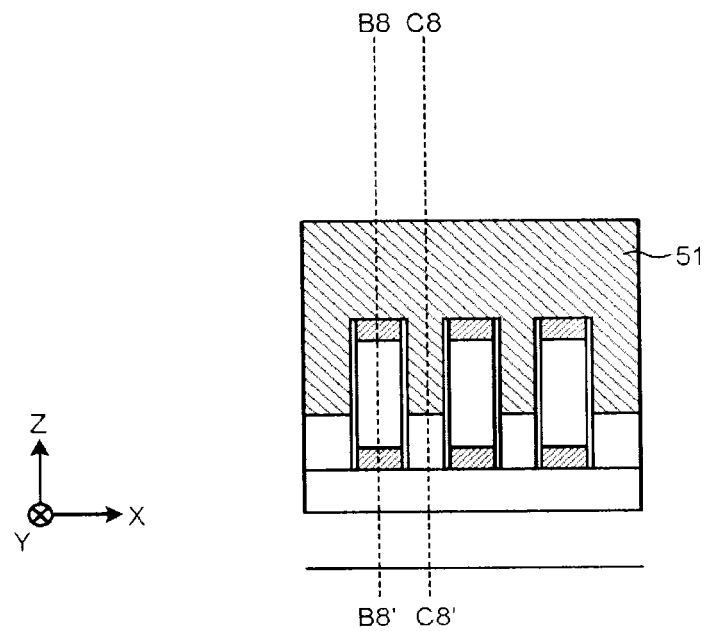
Figure 8B:
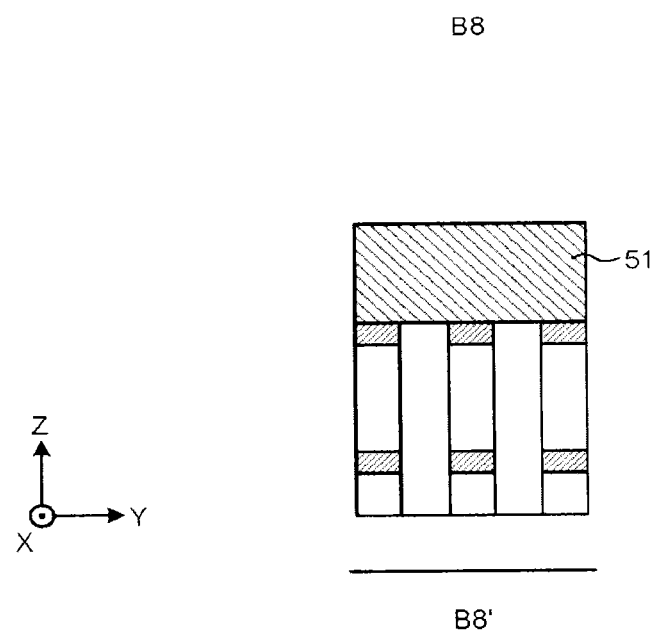
Figure 8C:
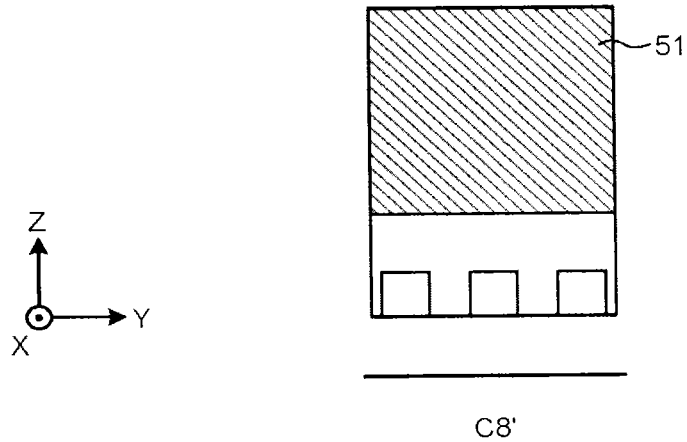

In the procedures illustrated in FIGS. 8A to 8C, the plurality of grooves TR2a are filled with a conductive material 51 by the sputtering method. FIG. 8A is a cross-sectional view illustrating the procedures. FIG. 8B is a diagram illustrating a cross section taken along line B8-B8' of the structure in FIG. 8A. FIG. 8C is a diagram illustrating a cross section taken along line C8-C8' of the structure in FIG. 8A.

For example, the conductive material 51 are deposited over the entire surface by the sputtering method. The conductive material 51 may be formed of a material having a metal (for example, tungsten) as a main component thereof, or may be formed of a material having a semiconductor (for example, silicon) as a main component thereof which contains the first or second conductivity type of impurity.

Figure 9A:
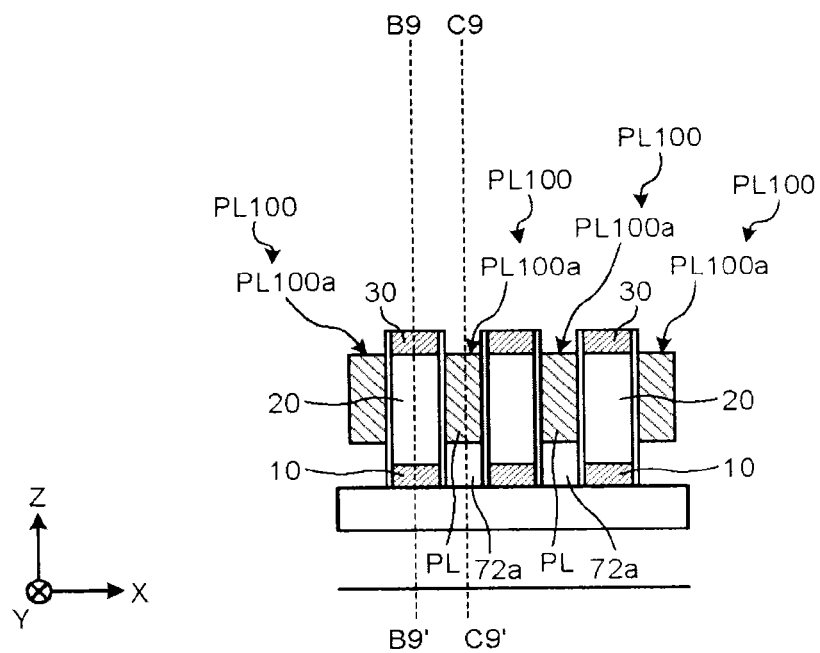
Figure 9B:
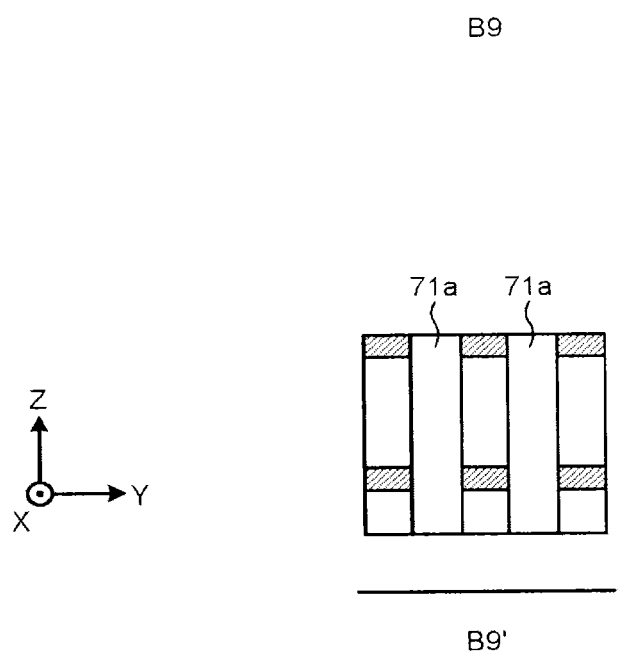
Figure 9C:
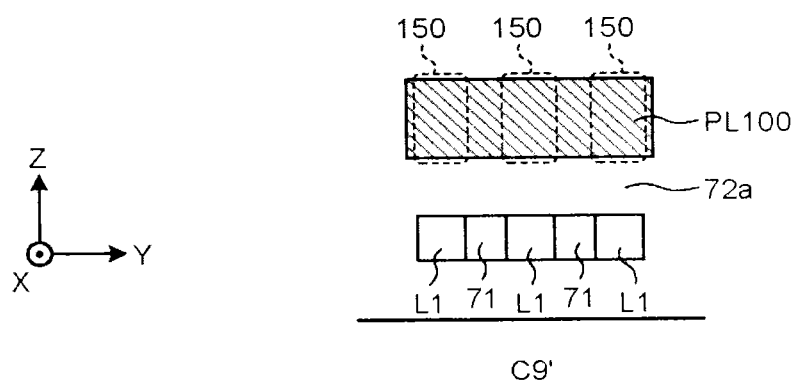

In the procedures illustrated in FIGS. 9A to 9C, the conductive material 51 is etched by the RIE method such that a member PL100 is left in each groove TR2a. FIG. 9A is a cross-sectional view illustrating the procedures. FIG. 9B is a diagram illustrating a cross section taken along line B9-B9' of the structure in FIG. 9A. FIG. 9C is a diagram illustrating a cross section taken along line C9-C9' of the structure in FIG. 9A.

In other words, the gate electrodes 150 of the respective thin film transistors are formed at positions where the members PL100 and the semiconductor pillars SP intersect.

At this time, the conductive material 51 is etched such that the overlap length OL1 between the gate electrode 150 and the semiconductor region 10 in the height direction (the Z direction) becomes shorter than the overlap length OL2 between the gate electrode 150 and the semiconductor region 30 in the Z direction. For example, in a case where OL2≅0, the etching period is adjusted such that the upper face PL100a of the member PL100 left in the groove TR2a becomes almost even in height with the boundary face between the semiconductor region 20 and the semiconductor region 30 in the semiconductor pillar SP1 from the surface SBa of the semiconductor substrate SB. Therefore, in each thin film transistor TFT100 (see FIG. 1A) thus formed, the gate electrode 150 is formed such that the overlap length OL1 between the gate electrode 150 and the semiconductor region 10 in the Z direction becomes shorter than the overlap length OL2 between the gate electrode 150 and the semiconductor region 30 in the Z direction.

As described above, in the first embodiment, the semiconductor device 100 is configured such that each thin film transistor TFT100 has an asymmetrical structure with respect to the center face CF of the semiconductor region 20 in the Z direction. Specifically, in each thin film transistor TFT100, the overlap length OL1 between the gate electrode 150 and the semiconductor region 10 in the Z direction is made different from the overlap length OL2 between the gate electrode 150 and the semiconductor region 30 in the Z direction.

Then, the memory cell stacking section MSS is formed. For example, an insulating film is deposited on the overall surface, and the upper face of the insulating film is planarized by the CMP method or the like. After that, the conductive layer L2 and the insulating film are alternately deposited to form a memory cell stack. Thereafter, a hole is formed to pass through the memory cell stack, and the resistance change film Re is formed on the side face of the hole. Furthermore, the hole is filled with a semiconductor having conductivity to form the semiconductor pillar SP. As a result, the semiconductor memory device according to the first embodiment can be manufactured.

It should be noted that, the first embodiment has been described about a case where the plurality of thin film transistors TFT100 are configured to have a shared gate structure in which the gate electrode is provided for two thin film transistors TFT100 adjacent in the X direction. However, instead of the shared gate structure, a double gate structure (split gate structure) or a surround gate structure may be employed. In the double gate structure (split gate structure), for example, the gate electrode 150 of the thin film transistor TFT100-4 and the gate electrode 150 of the thin film transistor TFT100-7 illustrated in FIG. 1A are split to be electrically separated from each other with the interlayer insulating film interposed therebetween. In the surround gate structure, for example, the gate electrode 150 of the thin film transistor TFT100-1 and the gate electrode 150 of the thin film transistor TFT100-4 illustrated in FIG. 1A are configured to share the semiconductor pillar SP to surround the semiconductor pillar in the X and Y directions.

First Modified Example

Figure 10A:
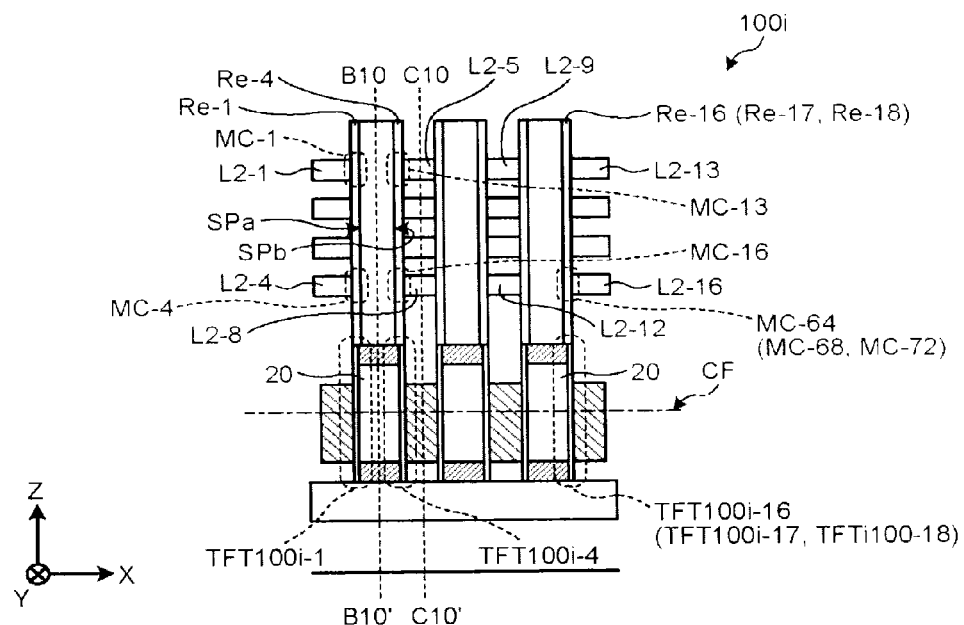
FIGS. 10A to 10E are diagrams illustrating cross-sectional structures of a semiconductor device according to a modified example of the first embodiment.
Figure 10B:
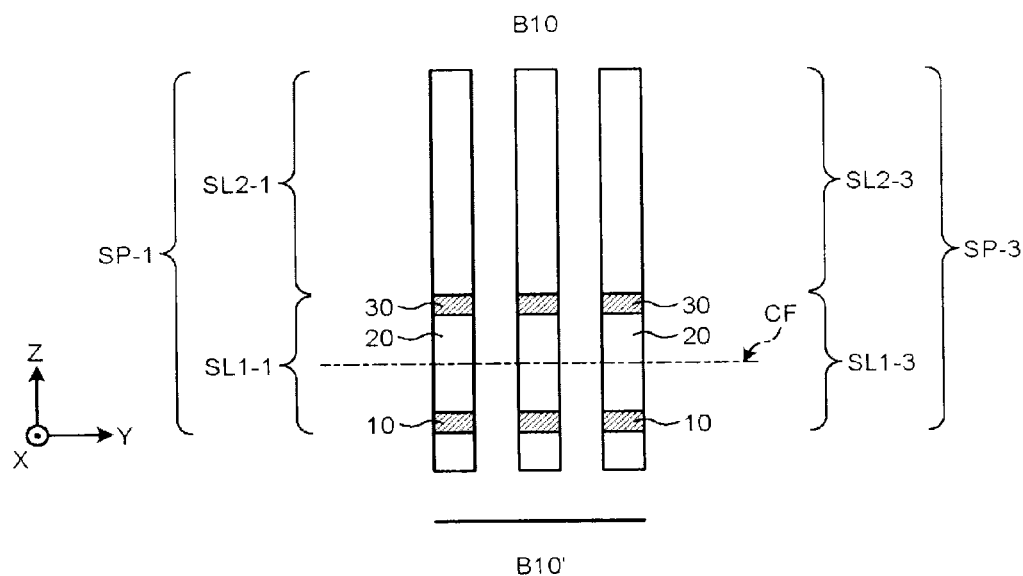
Figure 10C:
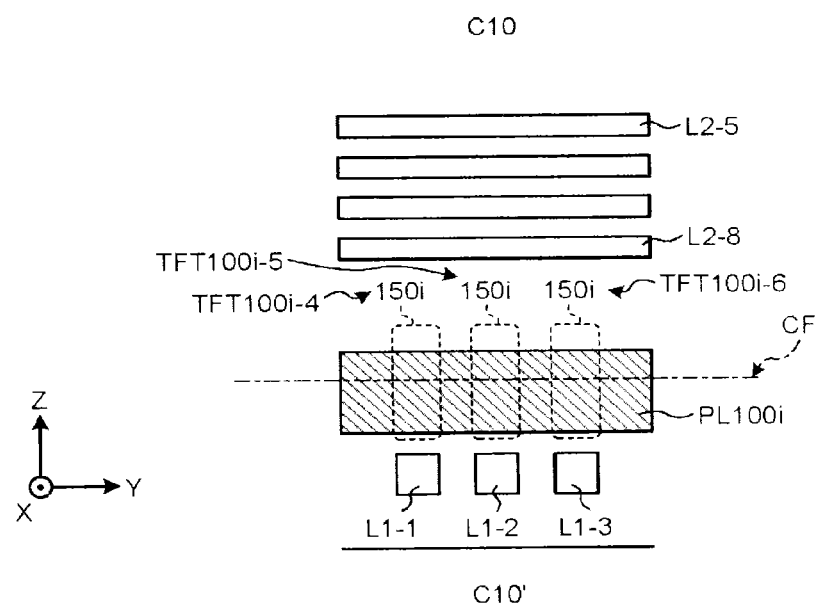

FIGS. 10A to 10C illustrate a modified example of the first embodiment. FIG. 10A is a diagram illustrating a cross-sectional structure of a semiconductor device 100i. FIG. 10B is a diagram illustrating a cross section taken along line B10-B10' of the structure in FIG. 10A. FIG. 10C is a diagram illustrating a cross section taken along line C10-C10' of the structure in FIG. 10A. Further, the cross-sectional view taken along line CF of FIG. 10A is substantially the same as FIG. 20D.

Figure 22B:
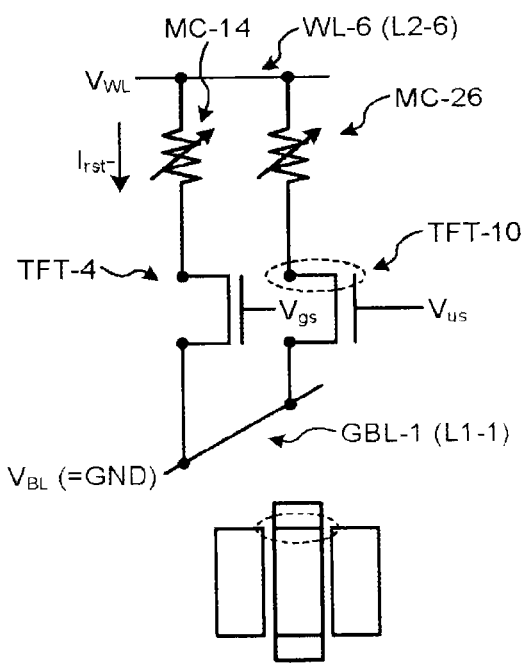
FIG. 22B is a diagram illustrating a GIDL current occurrence portion in a case where the memory cell is reset from the low resistance state to the high resistance state by making the voltage of the word line higher than that of the bit line.

A first modified example of the first embodiment relates to a case where each memory cell MC is reset from the low resistance state to the high resistance state by making the voltage of the conductive line L2 (word line) higher than that of the conductive line L1 (bit line). Further, it is considered the case of a structure in which each memory cell MC is reset from the low resistance state to the high resistance state by making the voltage of the conductive line L2 (word line) higher than that of the conductive line L1 (bit line). In this case, when the memory cell MC-14 is selected for resetting and the other memory cells MC-1 to MC-13 and MC-15 to MC-72 are unselected, the GIDL current is easily generated in the upper portion of the channel in the unselected thin film transistor TFT-10 as illustrated with the broken line in FIG. 22B.

As illustrated in FIGS. 10A to 10C, each thin film transistor TFT100$i$ has an asymmetrical structure with respect to the center face CF in order to weaken the electric field applied on the side of the semiconductor region 30 in the OFF state.

The semiconductor device 100$i$ includes a plurality of thin film transistors TFT100$i$-1 to TFT100$i$-18. In each thin film transistor TFT100$i$, an overlap length between a gate electrode 150$i$ and the semiconductor region 10 in the Z direction is made different from an overlap length between the gate electrode 150$i$ and the semiconductor region 30 in the Z direction in order to weaken the electric field applied on the side of the semiconductor region 30 in the OFF state.

Figure 10D:
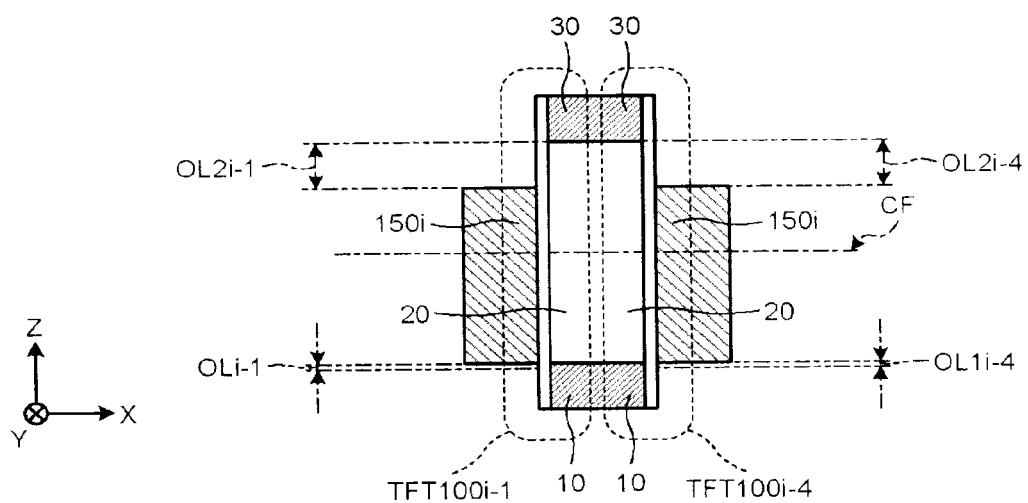
Figure 10E:
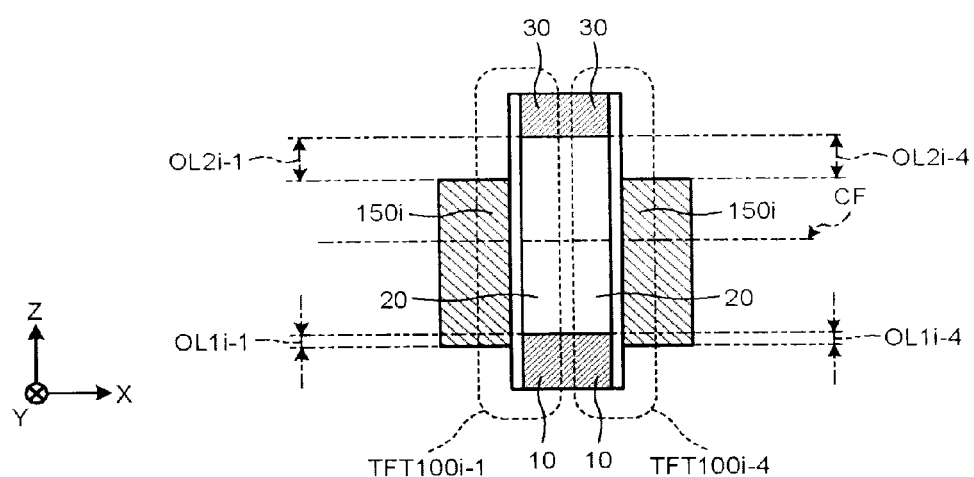

For example, as illustrated in FIG. 10D, the thin film transistor TFT100$i$-1 is configured such that an overlap length OL2$i$-1 between the gate electrode 150$i$ and the semiconductor region 30 in the Z direction is made smaller than an overlap length OL1$i$-1 between the gate electrode 150$i$ and the semiconductor region 10 in the Z direction. Further, the gate electrode 150 and the semiconductor region 30 in the Z direction are separated from each other, and the gate electrode 150 and the semiconductor region 10 are not overlapped with each other. FIG. 10D is a cross-sectional view illustrating the vicinity of the thin film transistor in the structure of FIG. 10A on a magnified scale. For example, in the case illustrated in FIG. 10D, since the gate electrode 150$i$ and the semiconductor region 20 are separated from each other, the overlap length OL2$i$-1 becomes less than zero (OL2$i$-1<0). On the other hand, since the boundary of the gate electrode 150$i$ and the boundary of the semiconductor region 30 are at substantially the same position, the overlap length OL1$i$-1 becomes substantially zero (OL1$i$-1≅0). Therefore, a relation of OL2$i$-1<OL1$i$-1 is established. In addition, the gate electrode 150$i$ and the semiconductor region 10 may be overlapped in the Z direction as illustrated in FIG. 10E. Further, the gate electrode 150$i$ and the semiconductor region 10 may be slightly separated in the Z direction as illustrated in FIG. 10D.

Similarly, as illustrated in FIG. 10D, the thin film transistor TFT100$i$-4 is configured such that an overlap length OL2$i$-4 between the gate electrode 150$i$ and the semiconductor region 30 in the Z direction is made smaller than an overlap length OL1$i$-4 between the gate electrode 150$i$ and the semiconductor region 10 in the Z direction. For example, in the case illustrated in FIG. 10D, a relation of OL2$i$-4<OL1$i$-4 is established.

It should be noted that, such an asymmetrical structure of the thin film transistor TFT100$i$-1 illustrated in FIG. 10D is also substantially the same as those of the thin film transistors TFT100$i$-5 and TFT100$i$-6 which are disposed in the Y direction as illustrated in FIG. 10C.

Therefore, the electric field applied on the side of the semiconductor region 30 in the OFF state can be weakened in each thin film transistor TFT100$i$. As a result, in a case where the thin film transistor TFT100$i$ is unselected when a predetermined memory cell is selected and reset from the low resistance state to the high resistance state, the GIDL current in the thin film transistor TFT100$i$ can be suppressed. Therefore, since the GIDL current of each thin film transistor TFT100$i$ in the OFF state can be suppressed, it is possible to suppress the current consumption in the semiconductor device 100$i$. Further, it is possible to easily secure a reset current Irst– required for flowing into the selected memory cell MC-14 as high a level as the memory cell can be reset from the low resistance state to the high resistance state.

Further, in each thin film transistor TFT100$i$, when each memory cell MC is set from the high resistance state to the low resistance state by making the voltage of the conductive line L1 (bit line) higher than that of the conductive line L2 (word line), a length of the overlapping region between the semiconductor region 10 serving as the drain and the gate electrode 150$i$ in the Z direction is substantially zero or equal to or longer than zero. With this configuration, it is possible to easily secure a drain current in the ON state of the thin film transistor TFT100$i$ corresponding to the memory cell MC to be set. Therefore, it is possible to easily secure a set current Iset+ required for flowing into the memory cell MC as high a level as the memory cell can be set from the high resistance state to the low resistance state.

Further, the semiconductor device 100$i$ may be manufactured by changing the manufacturing method of the first embodiment into that as illustrated in FIGS. 11A to 12C. FIGS. 11A to 12C are cross-sectional views illustrating procedures in the method of manufacturing the semiconductor device 100$i$.

Figure 11A:
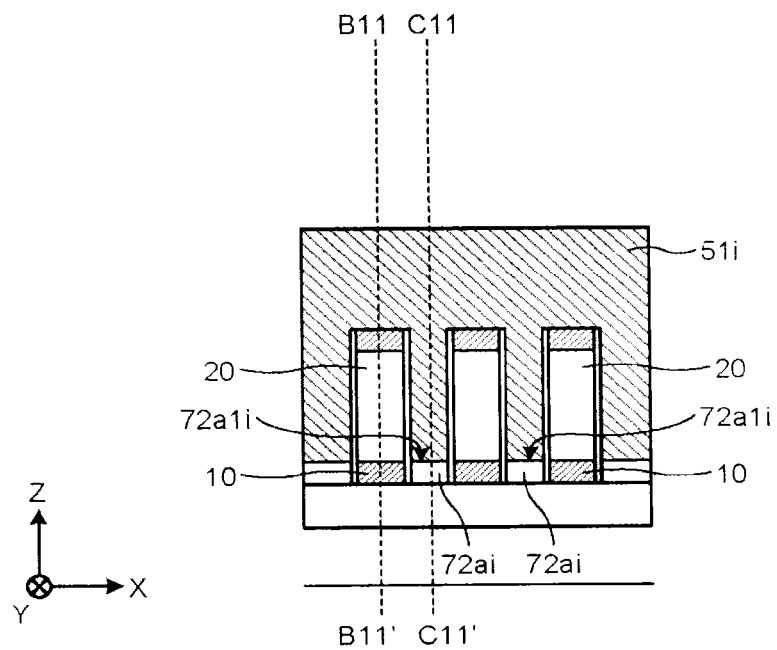
FIGS. 11A to 12C are diagrams illustrating a method of manufacturing the semiconductor device according to the modified example of the first embodiment.
Figure 11B:
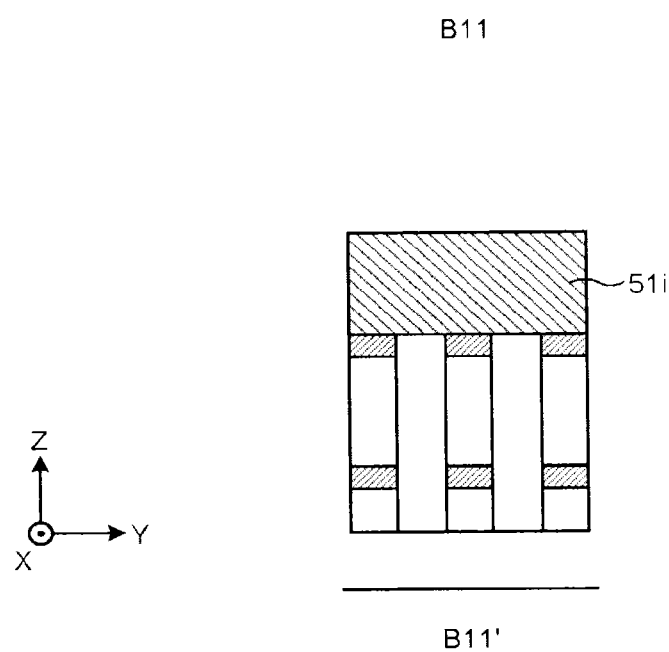
Figure 11C:
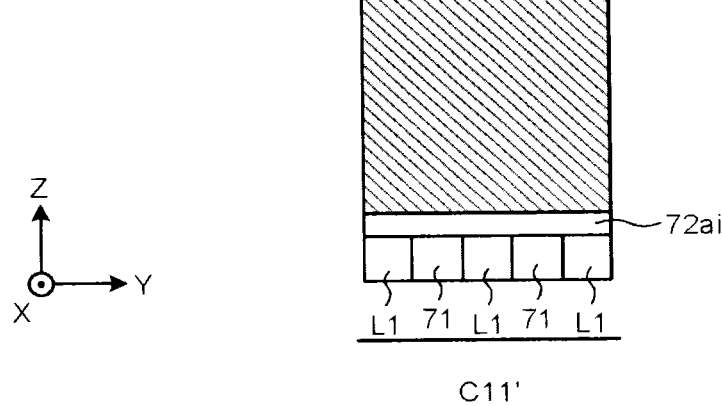

The procedures illustrated in FIGS. 11A to 11C are performed after the procedures illustrated in FIGS. 6A to 6C. FIG. 11A is a cross-sectional view illustrating the procedures. FIG. 11B is a diagram illustrating a cross section taken along line B11-B11' of the structure in FIG. 11A. FIG. 11C is a diagram illustrating a cross section taken along line C11-C11' of the structure in FIG. 2A.

In the procedures illustrated in FIGS. 11A to 11C, the interlayer insulating film 72 which fills the plurality of grooves TR2 (see FIG. 5A) is partially removed by the RIE method using the hard mask HM2 (see FIG. 6A) as a mask. At this time, the interlayer insulating film 72 (see FIG. 6A) is partially removed such that interlayer insulating film 72$a$ is left in the plurality of grooves TR2$a$ while the gate insulating films 40 are left in the side faces of the plurality of semiconductor pillars SP1. For example, the etching period is adjusted such that the upper face 72$a$1$i$ of the interlayer insulating film 72$ai$ left in the groove TR2$a$ becomes almost even in height with the boundary face between the semiconductor region 10 and the semiconductor region 20 in the semiconductor pillar SP1 from the surface SBa of the semiconductor substrate SB. Therefore, the bottom of each groove TR2$a$ becomes almost even in height with the boundary face between the semiconductor region 10 and the semiconductor region 20 in the semiconductor pillar SP1 from the surface SBa of the semiconductor substrate SB.

Then, the plurality of grooves TR2$a$ are filled with a conductive material 51$i$ by the sputtering method. For example, the conductive material 51$i$ is deposited over the entire surface by the sputtering method. The conductive material 51$i$ may be formed of a material having metal (for example, tungsten) as a main component thereof, or may be formed of a material having a semiconductor (for example, silicon) as a main component thereof which contains the first or second conductivity type of impurity.

Figure 12A:
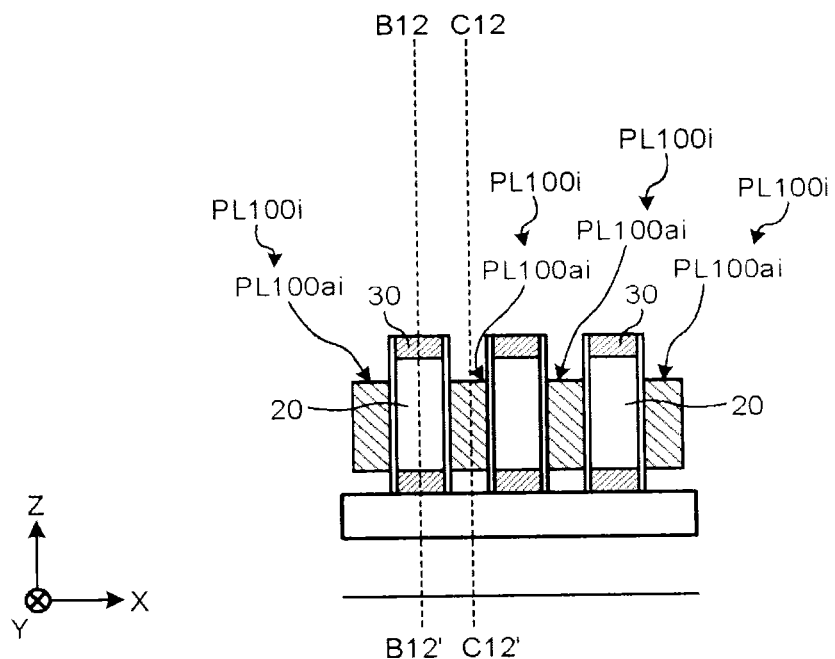
Figure 12B:
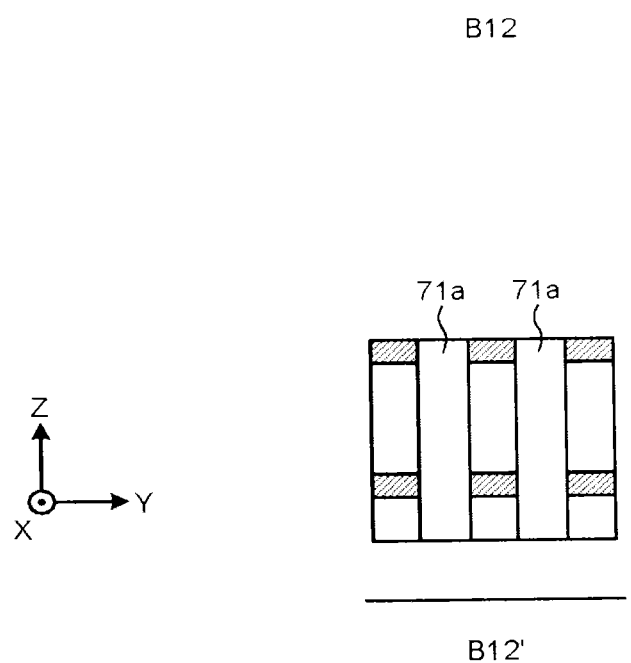
Figure 12C:
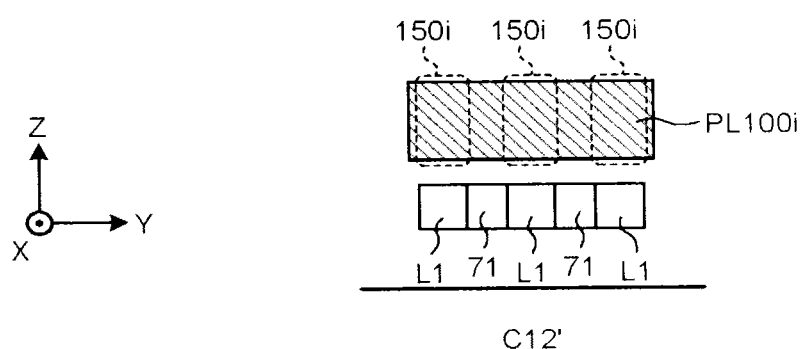

In the procedures illustrated in FIGS. 12A to 12C, the conductive material 51$i$ is etched by the RIE method such that a member PL100$i$ is left in each groove TR2$a$. FIG. 12A is a cross-sectional view illustrating the procedures. FIG. 12B is a diagram illustrating a cross section taken along line B12-B12' of the structure in FIG. 12A. FIG. 12C is a diagram illustrating a cross section taken along line C12-C12' the structure in FIG. 12A.

In other words, the gate electrodes 150$i$ are respectively formed at positions where the member PL100$i$ and the semiconductor pillars SP intersect.

At this time, the conductive material 51$i$ is etched under the etching condition such that the overlap length OL2$i$ between the gate electrode 150$i$ and the semiconductor region 30 in the Z direction becomes shorter than the overlap length OL1$i$ between the gate electrode 150$i$ and the semiconductor region 10 in the Z direction. For example, in the case of OL2$i$<0, the etching period is adjusted such that the upper face PL100$ai$ of the member PL100$i$ left in the groove TR2$a$ becomes lower than the boundary face between the semiconductor region 20 and the semiconductor region 30 in the semiconductor pillar SP1 from the surface SBa of the semiconductor substrate SB. Therefore, in each thin film transistor TFT100$i$ (see FIG. 10A) thus formed, the gate electrode 150$i$ is formed such that the overlap length OL2$i$ between the gate electrode 150$i$ and the semiconductor region 30 in the Z direction becomes shorter than the overlap length OL1$i$ between the gate electrode 150$i$ and the semiconductor region 10 in the Z direction. The subsequent procedures are the same as those in the first embodiment.

Second Embodiment

Next, a semiconductor device 200 according to a second embodiment will be described. In the following, portions different from the first embodiment will be mainly described.

In the second embodiment, each thin film transistor is configured asymmetrically with respect to the center face by making impurity concentrations different in the semiconductor regions on the upper and lower sides of the channel.

Figure 13A:
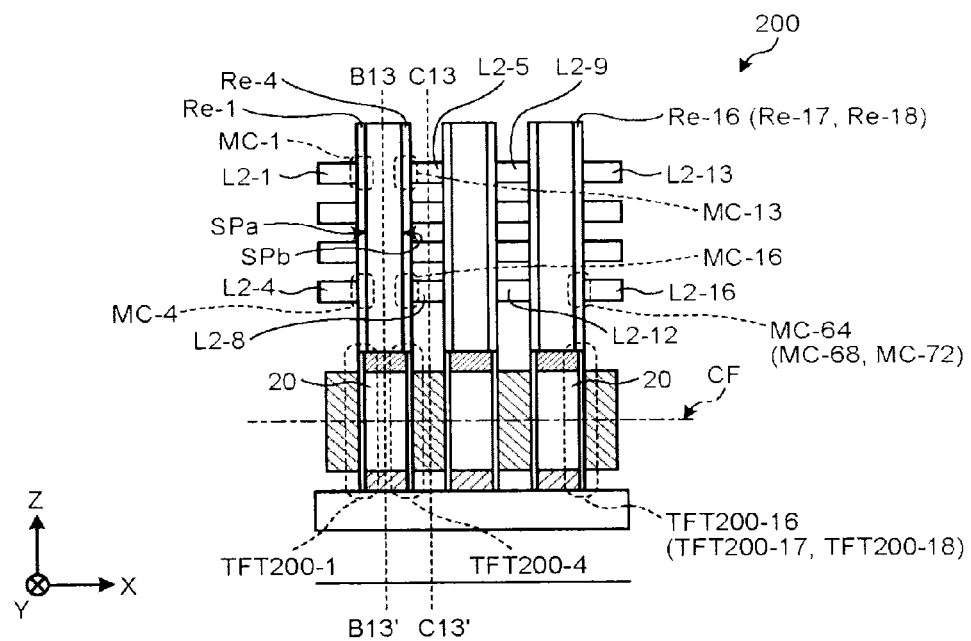
FIGS. 13A to 13E are diagrams illustrating cross-sectional structures of a semiconductor device according to a second embodiment.
Figure 13B:
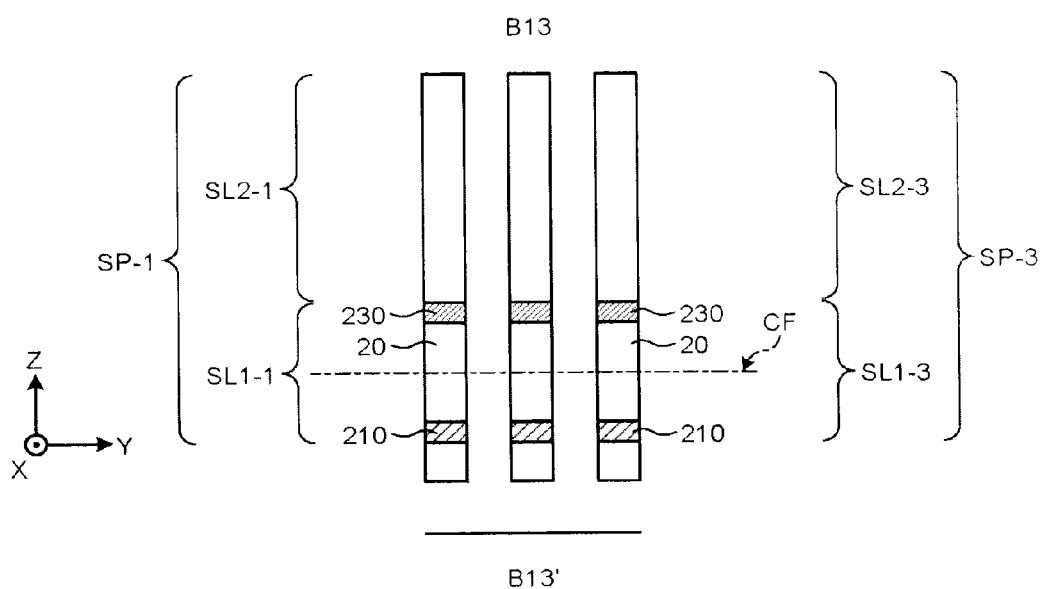
Figure 13C:
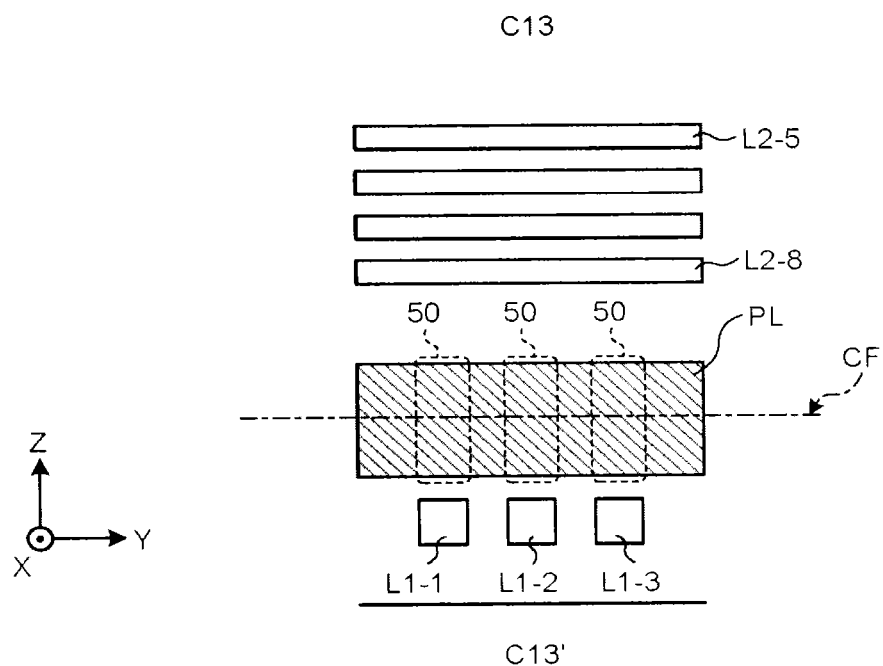

Specifically, the semiconductor device 200 includes a plurality of thin film transistors TFT200-1 to TFT200-18 as illustrated in FIGS. 13A to 13C. FIG. 13A is a diagram illustrating a cross-sectional structure of the semiconductor device 200. FIG. 13B is a diagram illustrating a cross section taken along line B13-B13' of the structure in FIG. 13A. FIG. 13C is a diagram illustrating a cross section taken along line C13-C13' of the structure in FIG. 13A.

In a case where each memory cell MC is configured to be reset from the low resistance state to the high resistance state by making the voltage of the conductive line L1 (bit line) higher than that of the conductive line L2 (word line), it is necessary to weaken the electric field applied on the side of the semiconductor region 10 of each thin film transistor TFT200 in the OFF state (see FIG. 22A). Therefore, each thin film transistor TFT200 has a structure in which the semiconductor regions 210 and 230 are formed asymmetrically with respect to the center face CF in order to weaken the electric field applied on the side of the semiconductor region 210 in the OFF state.

Figure 13D:
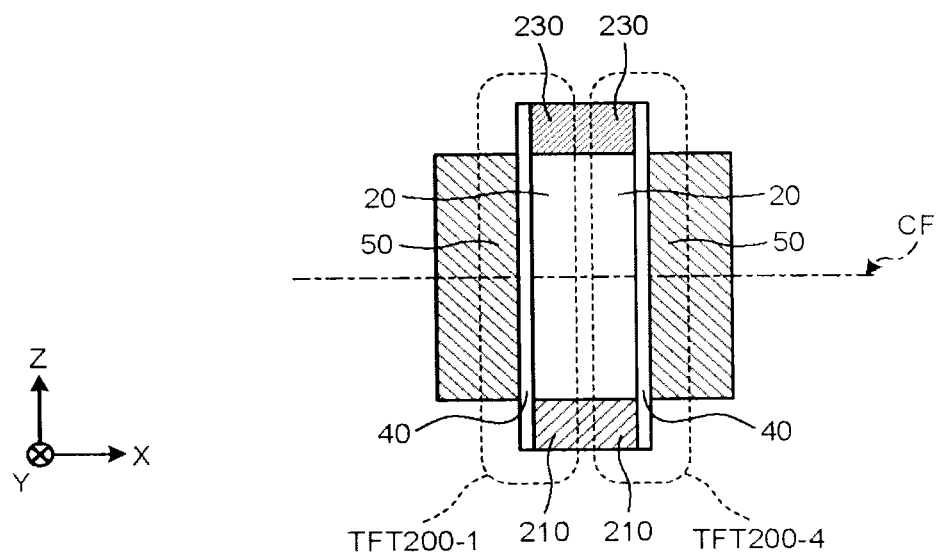

In other words, each thin film transistor TFT200 includes the semiconductor regions 210 and 230. As illustrated in FIG. 13D, the impurity concentration of the semiconductor region 210 in each thin film transistor TFT200 is lower than that of the semiconductor region 230. FIG. 13D is a cross-sectional view illustrating the vicinity of the thin film transistor in the structure of FIG. 13A on a magnified scale. In FIG. 13D, a difference in impurity concentration is illustrated by difference of hatching patterns between the semiconductor region 210 and the semiconductor region 230.

For example, the thin film transistor TFT200-1 may be configured such that the semiconductor region 230 contains the second conductivity type of impurity at a concentration level of $10^{20}$ cm$^{-3}$, and the semiconductor region 210 contains the second conductivity type of impurity at a concentration level in a range from $10^{18}$ to $10^{19}$ cm$^{-3}$. Similarly, the thin film transistor TFT200-4 may be configured such that the semiconductor region 230 contains the second conductivity type of impurity at a concentration level of $10^{20}$ cm$^{-3}$, and the semiconductor region 210 contains the second conductivity type of impurity at a concentration level in a range from $10^{18}$ to $10^{19}$ cm$^{-3}$.

Figure 14A:
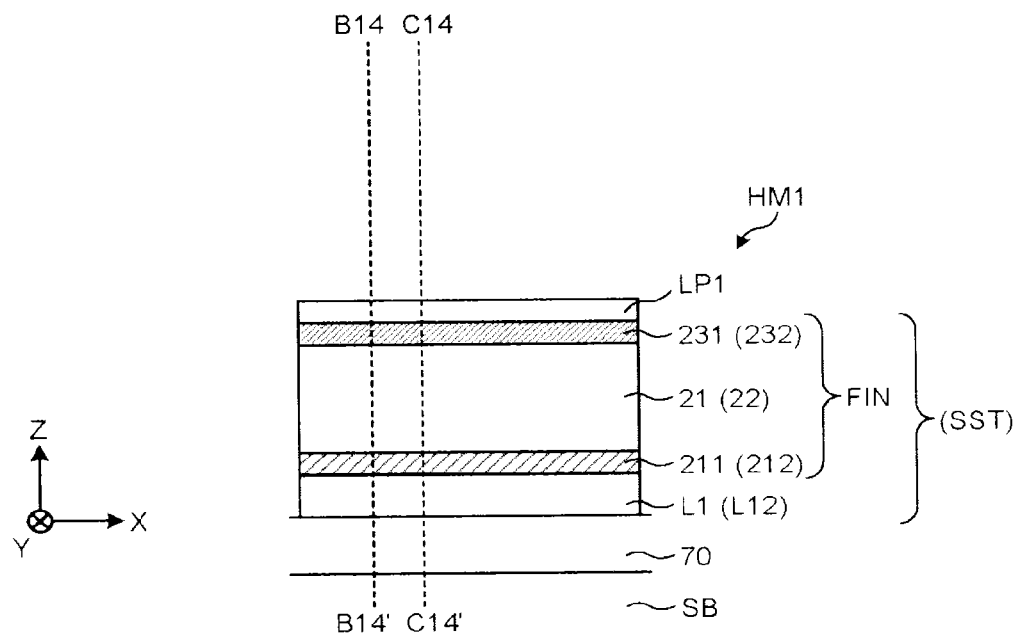
FIGS. 14A to 14C are diagrams illustrating a method of manufacturing the semiconductor device according to the second embodiment.
Figure 14B:
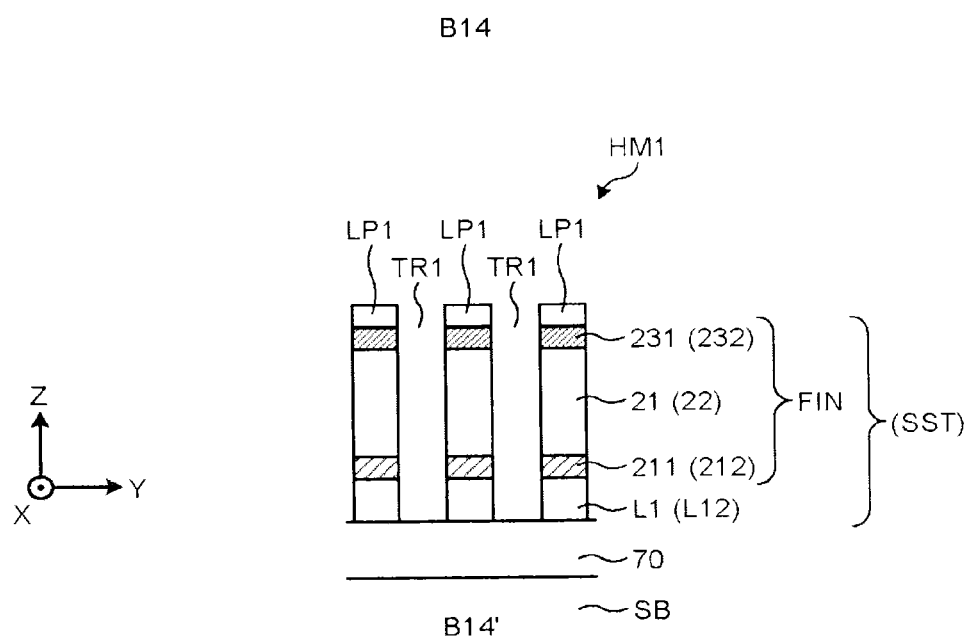
Figure 14C:
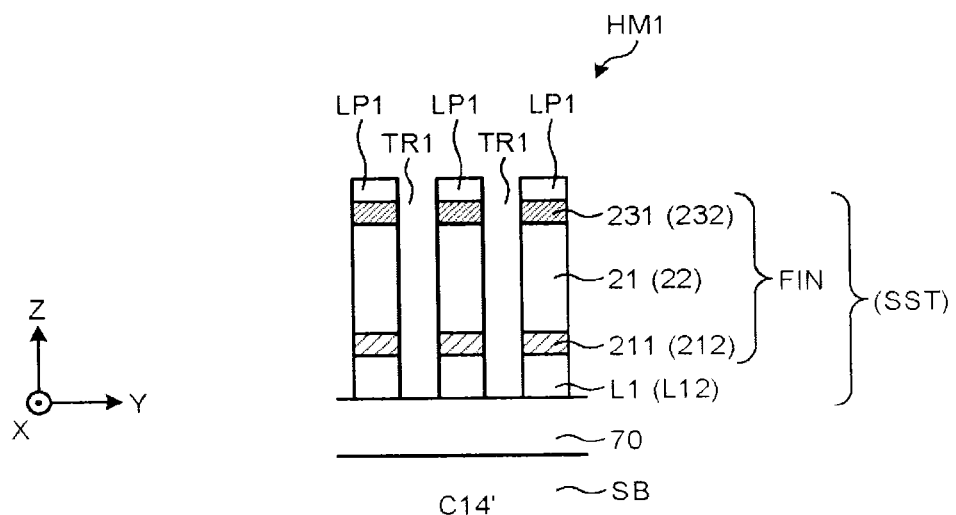

Further, the semiconductor device 200 may be manufactured by changing the manufacturing method of the first embodiment into that as illustrated in FIGS. 14A to 14C.

Figure 13E:
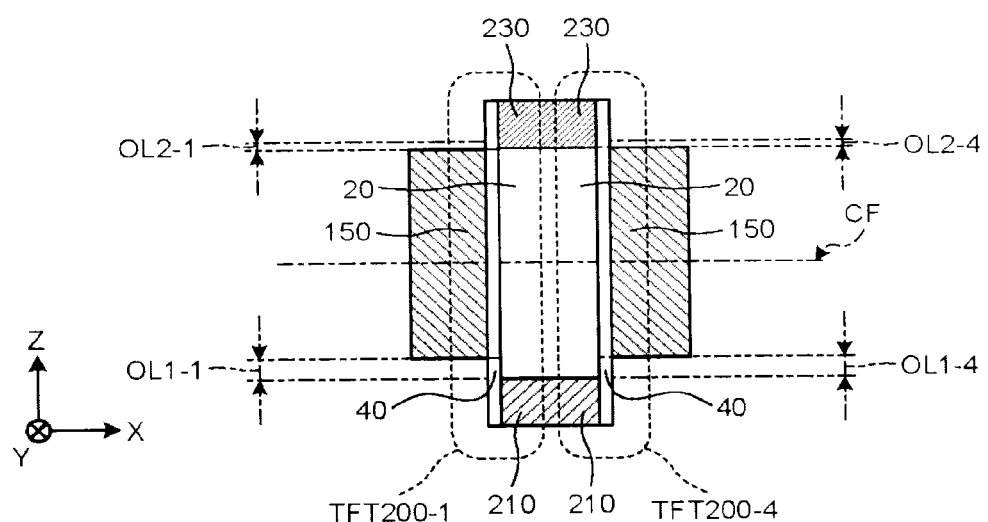

It should be noted that, the overlapping amount between the gate electrode 50 and the semiconductor region 210 may be substantially the same as that between the gate electrode 50 and the semiconductor region 230. Further, as illustrated in FIG. 13E, the boundary of the gate electrode 150 and the boundary of the semiconductor region 230 are substantially the same in the Z direction, but the gate electrode 150 and the semiconductor region 210 may not be overlapped with each other.

In the procedures illustrated in FIGS. 14A to 14C, an interlayer insulating film 70, a conductive film L12, a semiconductor film 212, a semiconductor film 22, and a semiconductor film 232 are layered on the semiconductor substrate SB in this order. FIG. 14A is a cross-sectional view illustrating the procedures. FIG. 14B is a diagram illustrating a cross section taken along line B14-B14' of the structure in FIG. 14A. FIG. 14C is a diagram illustrating a cross section taken along line C14-C14' of the structure in FIG. 14A.

The interlayer insulating film 70, for example, is formed of a material having a silicon oxide as a main component thereof. The conductive film L12, for example, is formed of a material having a metal (for example, aluminum) as a main component thereof. The semiconductor film 212 is formed of a material having a semiconductor (for example, silicon) containing the second conductivity type (for example, N type) of impurity. The N type of impurity, for example, is phosphorus or arsenic. The semiconductor film 22 is formed of a material having a semiconductor (for example, silicon) as a main component thereof which contains no impurities or alternatively contains the first conductivity type (for example, P type) of impurity having a concentration lower than that of the second conductivity type of impurity in the semiconductor film 212. The P type of impurity, for example, is boron or aluminum. The semiconductor film 232 is formed of a material having a semiconductor (for example, silicon) as its main component which contains the second conductivity type of impurity having a concentration higher than that of the first conductivity type of impurity in the semiconductor film 22.

At this time, the semiconductor film 212 and the semiconductor film 232 each are formed such that the impurity concentration of the semiconductor film 212 becomes lower than that of the semiconductor film 232. For example, the semiconductor region 212 may be formed to contain the second conductivity type of impurity at a concentration level in a range from $10^{18}$ to $10^{19}$ cm$^{-3}$, and the semiconductor region 232 may be formed to contain the second conductivity type of impurity at a concentration level of $10^{20}$ cm$^{-3}$.

It should be noted that, in a case where the impurities are introduced into the respective semiconductor films 212 and 232 by an ion implantation method, the above-mentioned structure can be realized by adjusting the injection amount of impurity ions into the semiconductor film 212 to be less than that of impurity ions into the semiconductor film 232.

Alternatively, in a case where the impurities are introduced into the respective semiconductor films 212 and 232 by a gas phase diffusion method, the above-mentioned structure can be realized by adjusting the concentration of impurity gas into the semiconductor film 212 to be less than that of impurity gas into the semiconductor film 232.

Next, the hard mask HM1 is formed on the stack structure SST by the photolithography. The anisotropic etching is performed by the RIE method using the hard mask HM1 as a mask until the surface of the interlayer insulating film 70 is exposed. Therefore, the plurality of line patterns LP1 of the hard mask HM1 are transferred onto the stack structure SST, and the stack structure SST is divided by the plurality of grooves TR1 which extend in the X direction, so that the plurality of conductive lines L1 and the plurality of fin layers FIN are formed. Each of the plurality of conductive lines L1 extends in the X direction. Each of the plurality of fin layers FIN is formed on the corresponding conductive line L1, protrudes in the Z direction, and extends in the X direction. In each fin layer FIN, a semiconductor layer 211, the semiconductor layer 21, and a semiconductor layer 231 are layered on the conductive line L1.

Then, a procedure of forming the memory cell stacking section MSS is performed.

As described above, in the second embodiment, the semiconductor device 200 is configured such that each thin film transistor TFT200 has an asymmetrical structure with respect to the center face CF of the semiconductor region 20 in the Z direction. For example, in a case where each memory cell MC is configured to be reset from the low resistance state to the high resistance state by making the voltage of the conductive line L1 (bit line) higher than that of the conductive line L2 (word line), the impurity concentration of the semiconductor region 210 is lower than that of the semiconductor region 230. Therefore, the electric field applied on the side of the semiconductor region 210 in the OFF state can be weakened in each thin film transistor TFT200. As a result, in a case where the thin film transistor TFT200 is unselected when a predetermined memory cell is selected and reset from the low resistance state to the high resistance state, the GIDL current in the thin film transistor TFT200 can be suppressed.

Therefore, since the GIDL current of each thin film transistor TFT200 in the OFF state can be suppressed, it is possible to suppress the current consumption in the semiconductor device 200. Further, it is possible to easily secure a reset current Irst+ required for flowing into the selected memory cell MC-14 as high a level as the memory cell can be reset from the low resistance state to the high resistance state.

Further, in the second embodiment, the impurity concentration of the semiconductor region 210 in each thin film transistor TFT200 is lower than that of the semiconductor region 230. In other words, in each thin film transistor TFT200, in a case where each memory cell MC is set from the high resistance state to the low resistance state by making the voltage of the conductive line L2 (word line) higher than that of the conductive line L1 (bit line), an impurity concentration of the semiconductor region 230 serving as the drain is secured. Therefore, it is possible to easily secure a reset current Iset− required for flowing into the memory cell MC as high a level as the memory cell can be set from the high resistance state to the low resistance state.

First Modified Example

Figure 15A:
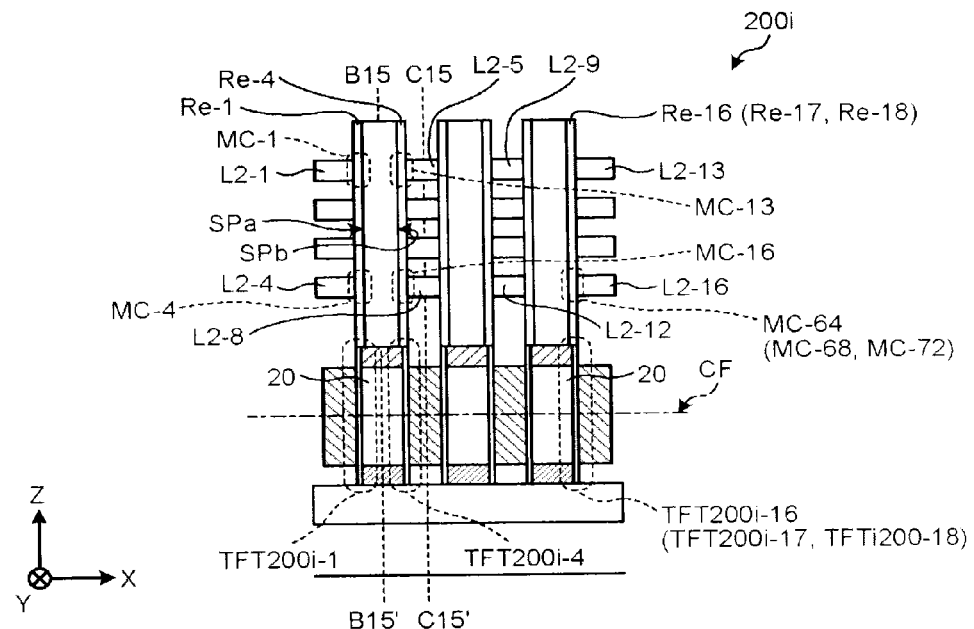
FIGS. 15A to 15E are diagrams illustrating cross-sectional structures of a semiconductor device according to a modified example of the second embodiment.
Figure 15B:
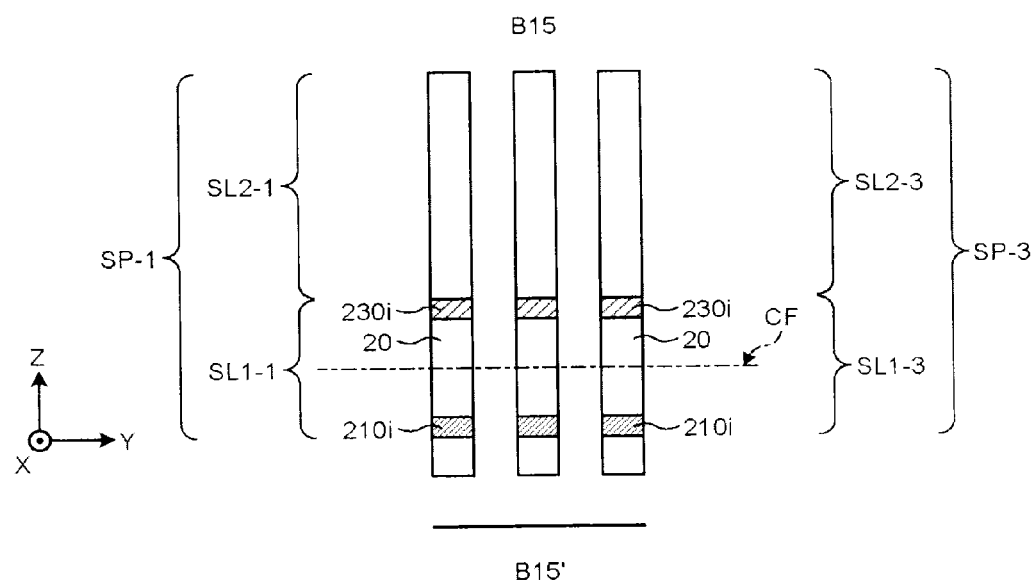
Figure 15C:
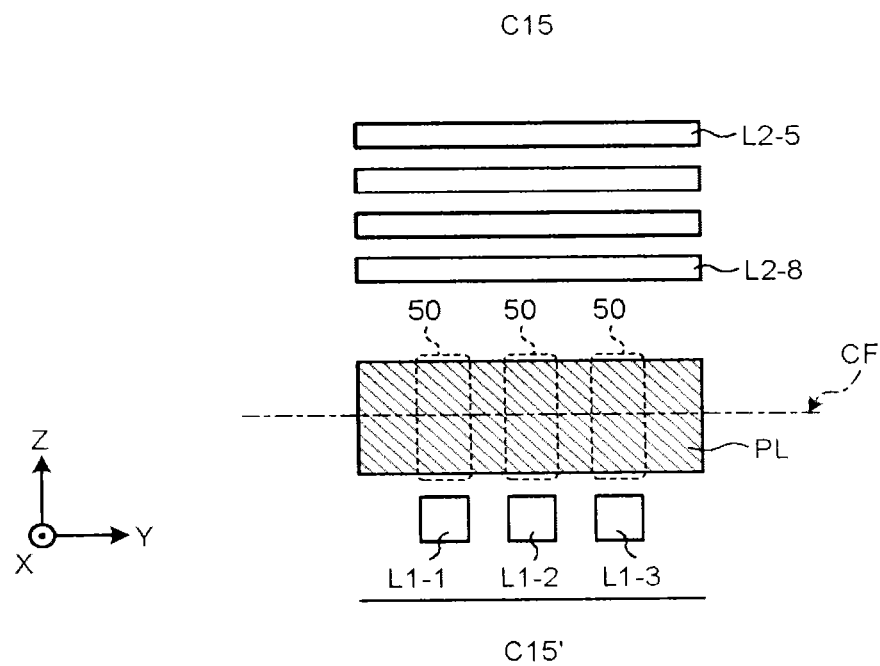

A modified example of the second embodiment is illustrated in FIGS. 15A to 15C. FIG. 15A is a diagram illustrating a cross-sectional structure of a semiconductor device 200$i$. FIG. 15B is a diagram illustrating a cross section taken along line B15-B15' of the structure in FIG. 15A. FIG. 15C is a diagram illustrating a cross section taken along line C15-C15' of the structure in FIG. 1A.

A first modified example of the second embodiment relates to a case where each memory cell MC is reset from the low resistance state to the high resistance state by making the voltage of the conductive line L2 (word line) higher than that of the conductive line L1 (bit line). Further, it is considered the case of a structure in which each memory cell MC is reset from the low resistance state to the high resistance state by making the voltage of the conductive line L2 (word line) higher than that of the conductive line L1 (bit line). In this case, when the memory cell MC-14 is selected for resetting and the other memory cells MC-1 to MC-13 and MC-15 to MC-72 are unselected, the GIDL current is easily generated in the upper portion of the channel in the unselected thin film transistor TFT-10 as illustrated with the broken line in FIG. 22B.

As illustrated in FIGS. 15A to 15C, each thin film transistor TFT200$i$ has an asymmetrical structure with respect to the center face CF in order to weaken the electric field applied on the side of the semiconductor region 30 in the OFF state.

Figure 15D:
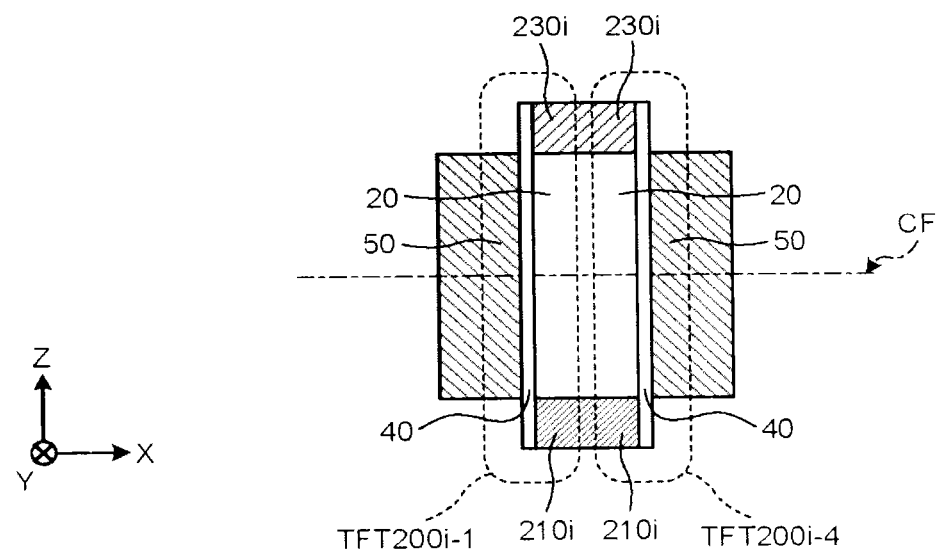

The semiconductor device 200$i$ includes a plurality of thin film transistors TFT200$i$-1 to TFT200$i$-18. In each thin film transistor TFT200$i$, the impurity concentration of the semiconductor region 230$i$ is lower than that of the semiconductor region 210$i$ in order to weaken the electric field applied on the side of the semiconductor region 230$i$ in the OFF state (see FIG. 15D). FIG. 15D is a cross-sectional view illustrating the vicinity of the thin film transistor in the structure of FIG. 15A on a magnified scale. In FIG. 15D, a difference in impurity concentration is illustrated by difference of hatching patterns between the semiconductor region 210$i$ and the semiconductor region 230$i$.

For example, the thin film transistor TFT200$i$-1 may be configured such that the semiconductor region 210$i$ contains the second conductivity type of impurity at a concentration level of $10^{20}$ cm$^{-3}$, and the semiconductor region 230$i$ contains the second conductivity type of impurity at a concentration level in a range from $10^{18}$ to $10^{19}$ cm$^{-3}$. Similarly, the thin film transistor TFT200$i$-4 may be configured such that the semiconductor region 210$i$ contains the second conductivity type of impurity at a concentration level of $10^{20}$ cm$^{-3}$, and the semiconductor region 230$i$ contains the second conductivity type of impurity at a concentration level in a range from $10^{18}$ to $10^{19}$ cm$^{-3}$.

Therefore, the electric field applied on the side of the semiconductor region 230$i$ in the OFF state can be weakened in each thin film transistor TFT200$i$. As a result, in a case where the thin film transistor TFT200$i$ is unselected when a predetermined memory cell is selected and reset from the low resistance state to the high resistance state, the GIDL current in the thin film transistor TFT200$i$ can be suppressed. Therefore, since the GIDL current of each thin film transistor TFT200$i$ in the OFF state can be suppressed, it is possible to suppress the current consumption in the semiconductor device 200$i$. Further, it is possible to easily secure a reset current Irst− required for flowing into the selected memory cell MC-14 as high a level as the memory cell can be reset from the low resistance state to the high resistance state.

Further, in each thin film transistor TFT200$i$, when each memory cell MC is set from the high resistance state to the low resistance state by making the voltage of the conductive line L1 (bit line) higher than that of the conductive line L2 (word line), an impurity concentration of the semiconductor region 210*i* serving as the drain is secured. With this configuration, it is possible to easily secure a drain current in the ON state of the thin film transistor TFT200*i* corresponding to the memory cell MC to be set. Therefore, it is possible to easily secure a reset current Iset+ required for flowing into the memory cell MC as high a level as the memory cell can be set from the high resistance state to the low resistance state.

Further, the method of manufacturing the semiconductor device 200*i* is basically equal to that of the second embodiment, but is different from that of the second embodiment in that, in the procedures illustrated in FIGS. 14A to 14C, the semiconductor film 212 and the semiconductor film 232 are formed to make the impurity concentration of the semiconductor film 232 become lower than that of the semiconductor film 212. For example, the semiconductor region 212 may be formed to contain the second conductivity type of impurity at a concentration level of $10^{20}$ cm$^{-3}$, and the semiconductor region 232 may be formed to contain the second conductivity type of impurity at a concentration level in a range from $10^{18}$ to $10^{19}$ cm$^{-3}$. The subsequent procedures are substantially the same as those in the second embodiment.

Second Modified Example

It should be noted that, each thin film transistor TFT200 in the second embodiment is configured such that the impurity concentration of the semiconductor region 210 becomes lower than that of the semiconductor region 230. Instead, each thin film transistor TFT200 may be configured such that a diffusion length of the semiconductor region 210 becomes longer than that of the semiconductor region 230. Herein, the diffusion length means a length over which the impurity concentration of the semiconductor region 210 or 230 becomes the impurity concentration of the semiconductor region 20. Further, the diffusion length of the semiconductor region 210 may be a distance from the boundary between the end of the gate electrode on a side of the semiconductor region 210 and the semiconductor region 20 to a place where the concentration of the semiconductor region 20 reaches an approximate average value. Similarly, the diffusion length of the semiconductor region 230 may be a distance from the boundary between the end of the gate electrode on a side of the semiconductor region 230 and the semiconductor region 20 to a place where the concentration of the semiconductor region 20 reaches an approximate average value. In addition, in the modified example, an average concentration of impurity in the semiconductor regions 210 and 230 can be made to be substantially the same.

Figure 15E:
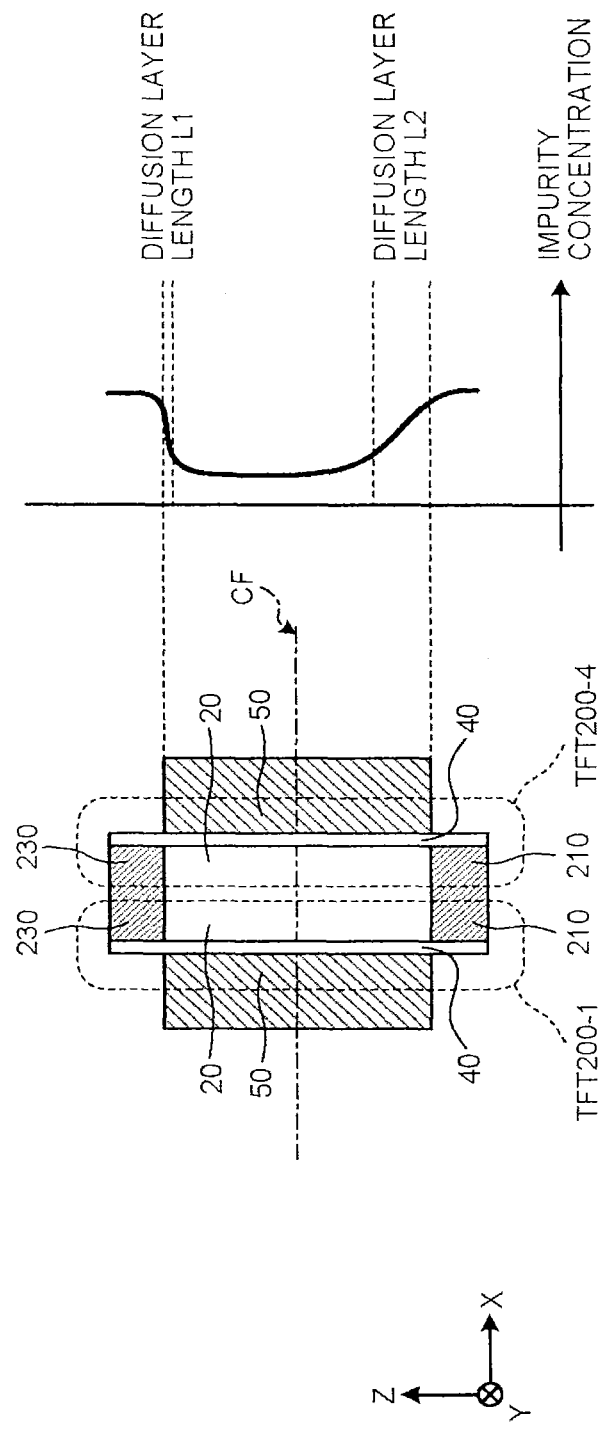

In other words, as illustrated in FIG. 15E, since the diffusion length of the semiconductor region 210 is longer than that of the semiconductor region 230, the impurity concentration on a side of the semiconductor region 210 changes more smoothly than that on a side of the semiconductor region 230. As a result, the electric field applied between the gate electrode on a side of the semiconductor region 210 and the semiconductor region 210 is weakened, and the GIDL current becomes reduced.

Third Embodiment

Next, a semiconductor device 300 according to a third embodiment will be described. In the following, portions different from the first embodiment will be mainly described.

In the third embodiment, each thin film transistor is configured asymmetrically with respect to the center face by making the shape of the gate electrode different in its upper and lower portions.

Figure 16A:
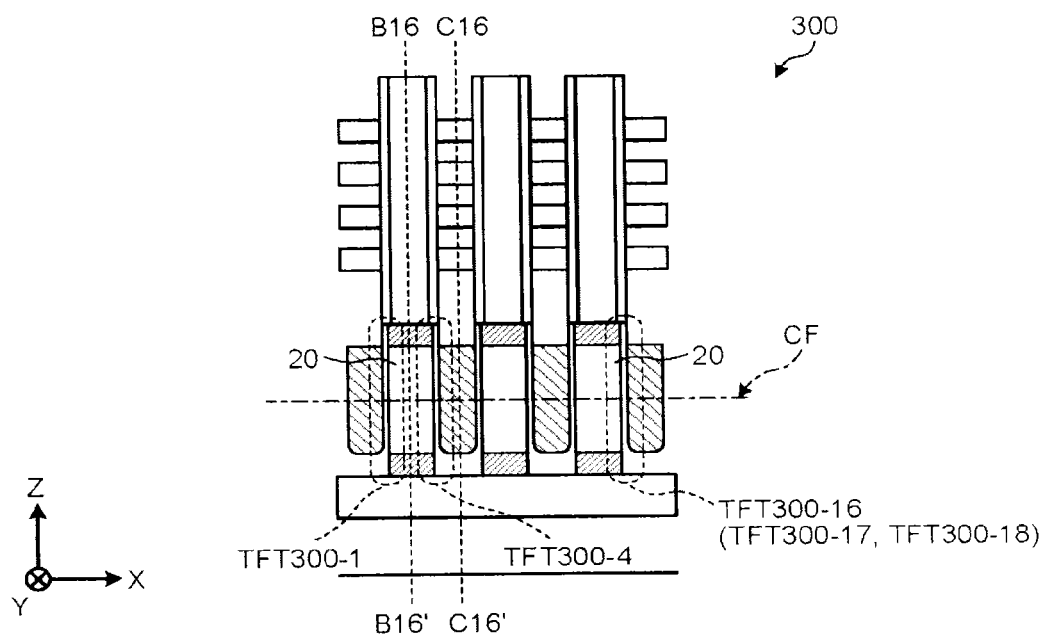
FIGS. 16A to 16D are diagrams illustrating cross-sectional structures of a semiconductor device according to a third embodiment.
Figure 16B:
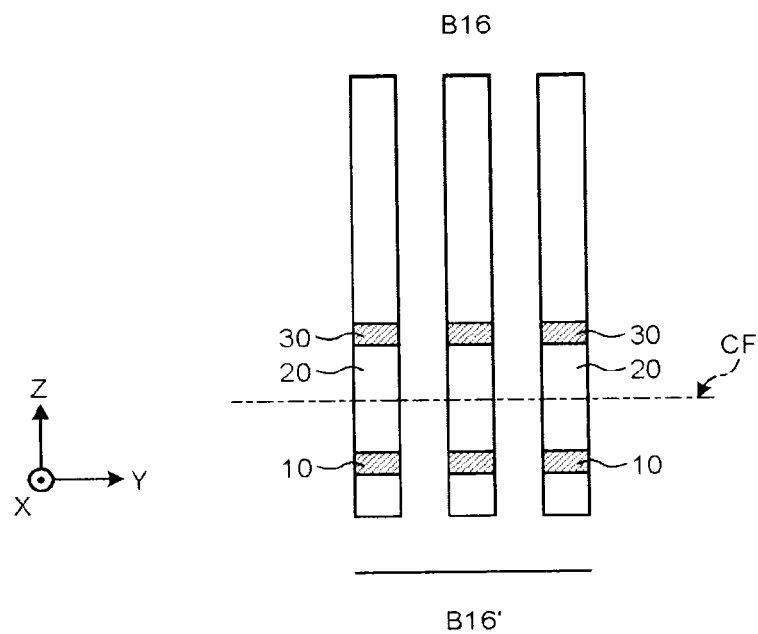
Figure 16C:
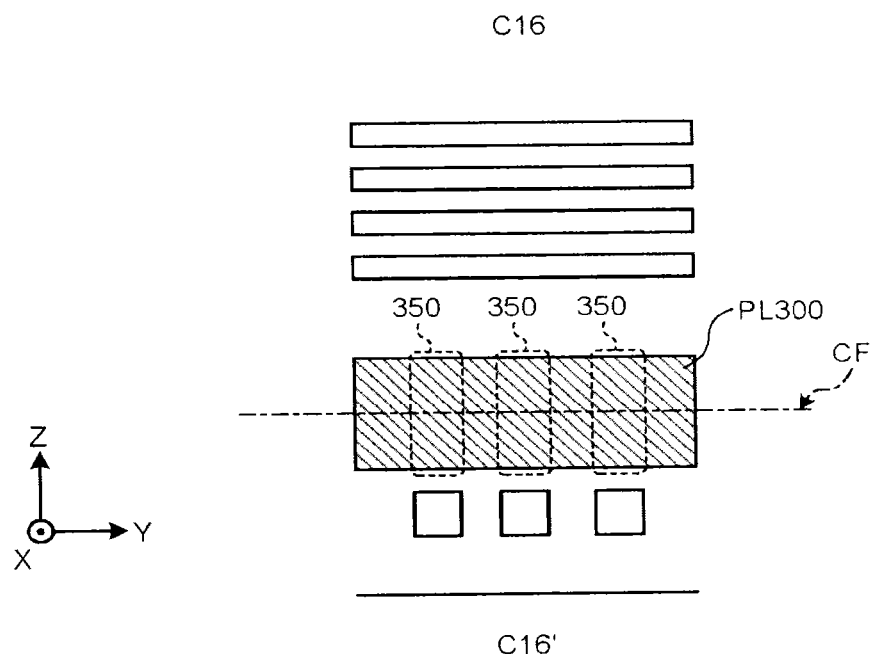

Specifically, the semiconductor device 300 includes a plurality of thin film transistors TFT300-1 to TFT300-18 as illustrated in FIGS. 16A to 16C. FIG. 16A is a diagram illustrating a cross-sectional structure of the semiconductor device 300. FIG. 16B is a diagram illustrating a cross section taken along line B16-B16' of the structure in FIG. 16A. FIG. 16C is a diagram illustrating a cross section taken along line C16-C16' of the structure in FIG. 16A.

In a case where each memory cell MC is configured to be reset from the low resistance state to the high resistance state by making the voltage of the conductive line L1 (bit line) higher than that of the conductive line L2 (word line), it is necessary to weaken the electric field applied on the side of the semiconductor region 10 of each thin film transistor TFT300 in the OFF state (see FIG. 22A). Therefore, each thin film transistor TFT300 has the asymmetrical structure with respect to the center face CF in order to weaken the electric field applied on the side of the semiconductor region 10 in the OFF state.

In other words, each thin film transistor TFT300 includes a gate electrode 350 instead of the gate electrode 50 (see FIGS. 20A and 20C). In each thin film transistor TFT300, the shape of the gate electrode 350 is formed asymmetrically with respect to the center face CF in order to weaken the electric field applied on a side of the semiconductor region 10 in the OFF state.

Figure 16D:
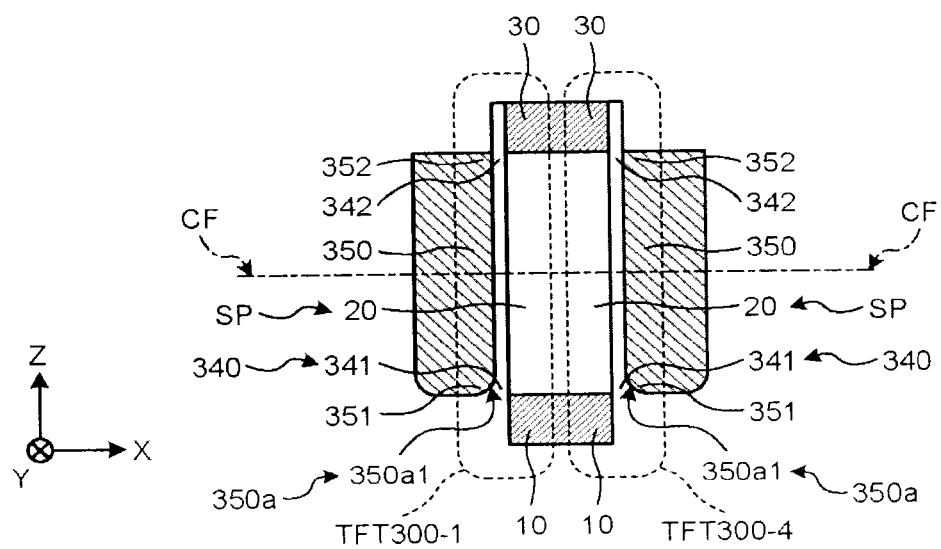

For example, as illustrated in FIG. 16D, the thin film transistor TFT300-1 is configured such that a principal surface 350*a* covering a gate insulating film 340 in the gate electrode 350 is curved so that a lower portion 350*a*1 is spaced apart from the semiconductor pillar SP. FIG. 16D is a cross-sectional view illustrating the vicinity of the thin film transistor in the structure of FIG. 16A on a magnified scale. Accordingly, the gate insulating film 340 is formed such that the film thickness of a lower portion 341 is thicker than that of an upper portion 342. With this configuration, when the gate electrode 350 is seen from the XZ cross-sectional plane, the curvature of an edge 351 on a side of the semiconductor region 10 becomes large (roundish) compared to the curvature of an edge 352 on a side of the semiconductor region 30.

Similarly, as illustrated in FIG. 16D, the thin film transistor TFT300-4 is configured such that the principal surface 350*a* covering the gate insulating film 340 in the gate electrode 350 is curved so that the lower portion 350*a*1 is spaced apart from the semiconductor pillar SP. Accordingly, the gate insulating film 340 is formed such that the film thickness of the lower portion 341 is thicker than that of the upper portion 342. With this configuration, when the gate electrode 350 is seen from the XZ cross-sectional plane, the curvature of the edge 351 on a side of the semiconductor region 10 becomes large (roundish) compared to the curvature of the edge 352 on a side of the semiconductor region 30.

Figure 17A:
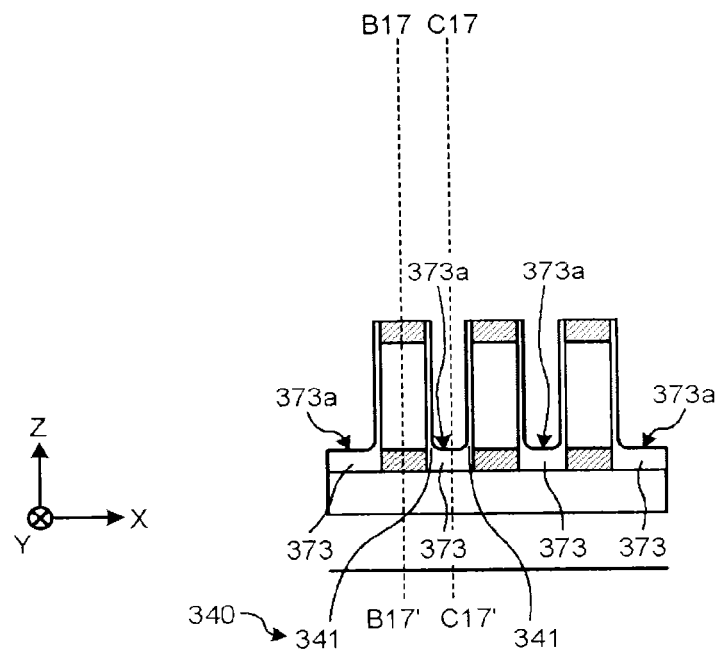
FIGS. 17A to 17C are diagrams illustrating a method of manufacturing the semiconductor device according to the third embodiment.
Figure 17B:
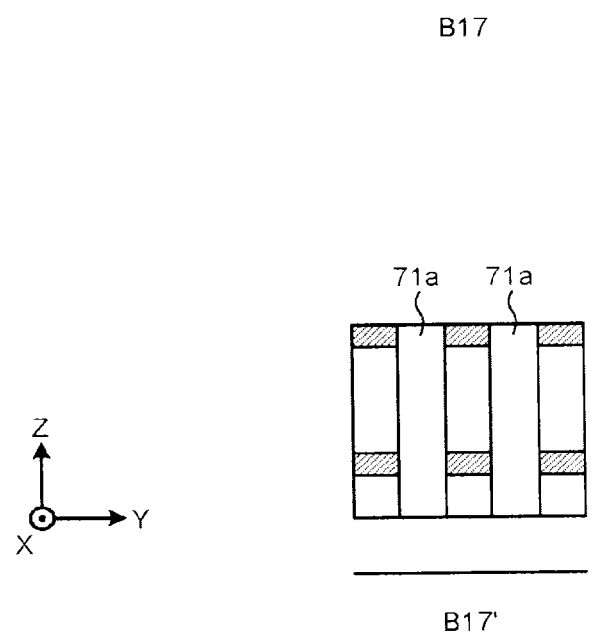
Figure 17C:
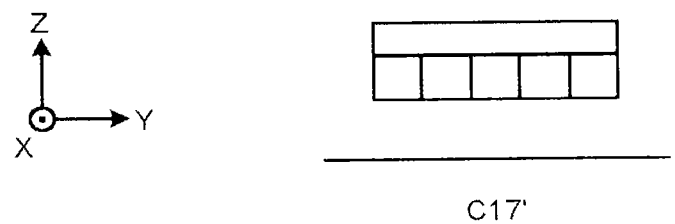

Further, the semiconductor device 300 may be manufactured by changing the manufacturing method of the first embodiment into that as illustrated in FIGS. 17A to 17C.

The procedures illustrated in FIGS. 17A to 17C are performed after the procedures illustrated in FIGS. 5A to 5C. FIG. 17A is a cross-sectional view illustrating the procedures. FIG. 17B is a diagram illustrating a cross section taken along line B17-B17' of the structure in FIG. 17A. FIG. 17C is a diagram illustrating a cross section taken along line C17-C17' of the structure in FIG. 17A.

In the procedures illustrated in FIGS. 17A to 17C, the plurality of grooves TR2 (see FIG. 5A) are filled with an oxide film 373. For example, the oxide film 373 is deposited over the entire surface by the CVD method. Then, the oxide film 373 which fills the grooves TR2 is partially removed by the etching. At this time, the etching period is adjusted in order to make the upper face 373a of the oxide film 373 become almost even in height with the boundary face between the semiconductor region 10 and the semiconductor region 20 in the semiconductor pillar SP1.

Then, the exposed side faces of the plurality of semiconductor pillars SP1 are oxidized by the thermal oxidation method to form gate oxide films 340. Therefore, the film thickness of the lower portion 341 of the gate oxide film 340 in the X direction becomes thick and is linked to the oxide film 373. Then, the groove TR2a is filled with the conductive material 51i, and the gate electrode 350 is formed by the anisotropic etching. As a result, in the gate electrode 350, the curvature of the edge 351 on a side of the semiconductor region 10 becomes large compared to the curvature of the edge 352 on a side of the semiconductor region 30.

Then, a procedure of forming the memory cell stacking section MSS is performed.

As described above, in the third embodiment, the gate electrode 350 in each thin film transistor TFT300 of the semiconductor device 300 has an asymmetrical shape with respect to the center face CF of the semiconductor region 20 in the Z direction. In each thin film transistor TFT300, the principal surface 350a of the gate electrode 350 which covers the gate insulating film 340 is curved so that the lower portion 350a1 is spaced apart from the semiconductor pillar SP. Further, the gate insulating film 340 is configured such that the film thickness of the lower portion 341 is thicker than that of the upper portion 342. For example, in a case where each memory cell MC is configured to be reset from the low resistance state to the high resistance state by making the voltage of the conductive line L1 (bit line) higher than that of the conductive line L2 (word line), it is possible to weaken the electric field applied on the side of the semiconductor region 10 of each thin film transistor TFT300 in the OFF state. As a result, in a case where the thin film transistor TFT300 is unselected when a predetermined memory cell is selected and reset from the low resistance state to the high resistance state, the GIDL current in the thin film transistor TFT300 can be suppressed.

Therefore, since the GIDL current of each thin film transistor TFT300 in the OFF state can be suppressed, it is possible to suppress the current consumption in the semiconductor device 300. Further, it is possible to easily secure a reset current Irst+ required for flowing into the selected memory cell MC-14 as high a level as the memory cell can be reset from the low resistance state to the high resistance state.

Further, in the third embodiment, when the gate electrode 350 of each thin film transistor TFT300 is seen from the XZ plane, the edge 351 on a side of the semiconductor region 10 is roundish compared to the edge 352 on a side of the semiconductor region 30. In other words, in the ZX plane, the curvature of the gate electrode on a side of the semiconductor region 10 is larger than that of the gate electrode on a side of the semiconductor region 30. In other words, in each thin film transistor TFT300, when each memory cell MC is set from the high resistance state to the low resistance state by making the voltage of the conductive line L2 (word line) higher than that of the conductive line L1 (bit line), it is possible to easily secure the electric field between the semiconductor region 30 serving as the drain and the gate electrode 350. Therefore, it is possible to easily secure a reset current Iset− required for flowing into the memory cell MC as high a level as the memory cell can be set from the high resistance state to the low resistance state.

First Modified Example

Figure 18A:
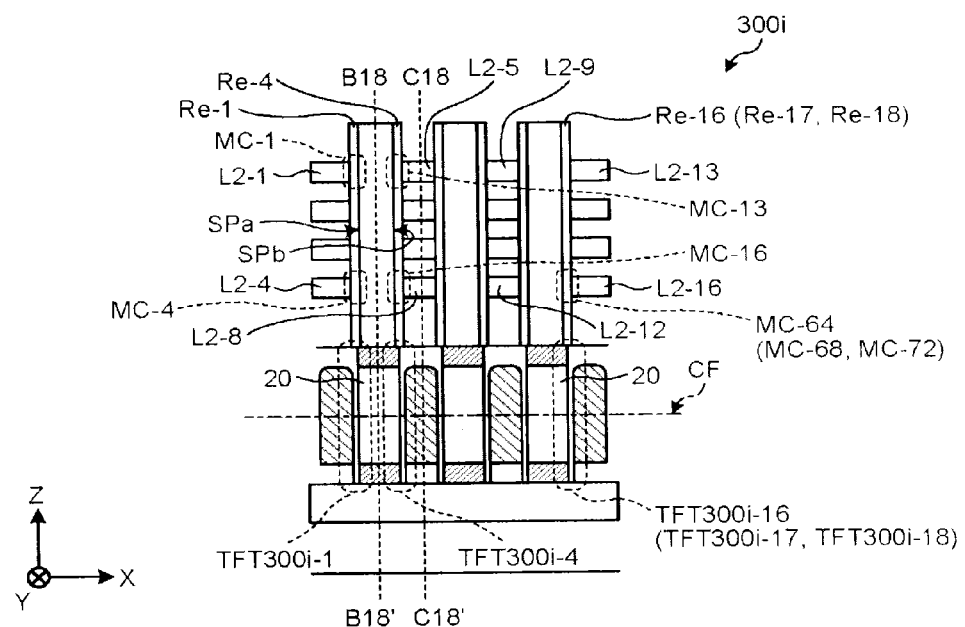
FIGS. 18A to 18D are diagrams illustrating cross-sectional structures of a semiconductor device according to a modified example of the third embodiment.
Figure 18B:
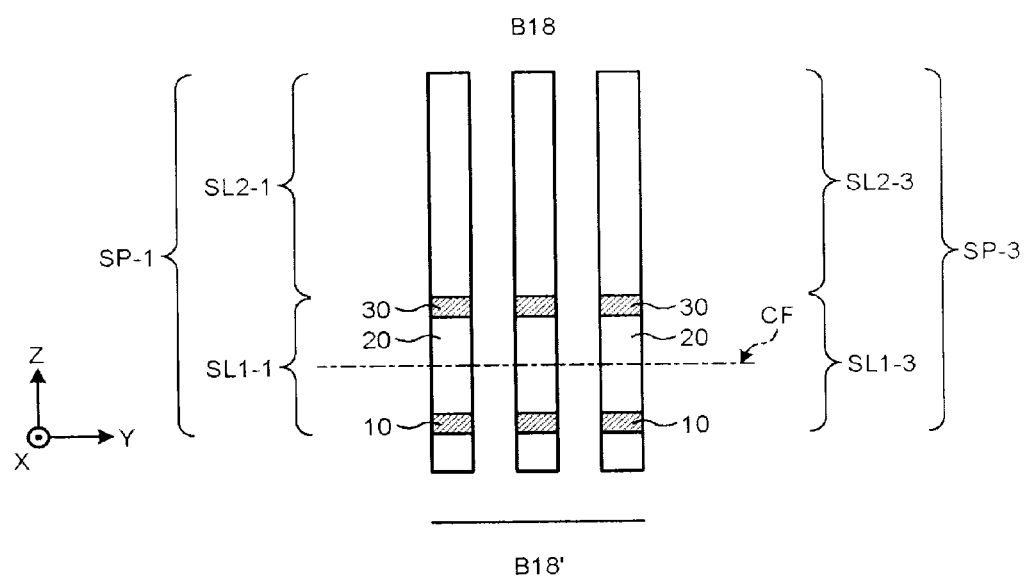
Figure 18C:
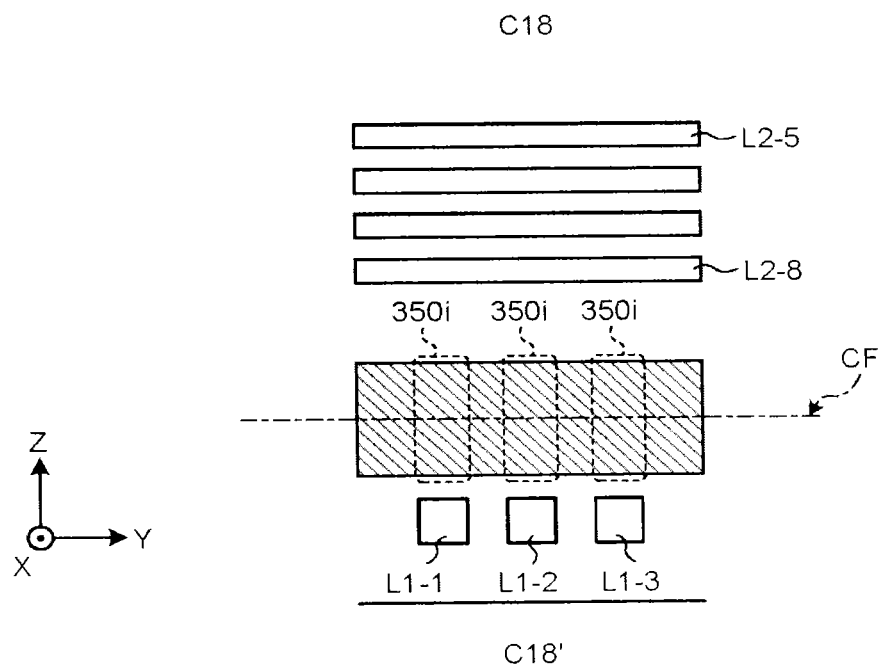

In addition, FIGS. 18A to 18C illustrate a modified example of the third embodiment. FIG. 18A is a diagram illustrating a cross-sectional structure of a semiconductor device 300i. FIG. 18B is a diagram illustrating a cross section taken along line B18-B18' of the structure in FIG. 18A. FIG. 18C is a diagram illustrating a cross section taken along line C18-C18' of the structure in FIG. 18A.

A first modified example of the third embodiment relates to a case where each memory cell MC is reset from the low resistance state to the high resistance state by making the voltage of the conductive line L2 (word line) higher than that of the conductive line L1 (bit line). Further, it is considered that the case of a structure in which each memory cell MC is reset from the low resistance state to the high resistance state by making the voltage of the conductive line L2 (word line) higher than that of the conductive line L1 (bit line). In this case, when the memory cell MC-14 is selected for resetting and the other memory cells MC-1 to MC-13 and MC-15 to MC-72 are unselected, the GIDL current is easily generated in the upper portion of the channel in the unselected thin film transistor TFT-10 as illustrated with the broken line in FIG. 22B.

As illustrated in FIGS. 18A to 18C, each thin film transistor TFT300i has an asymmetrical structure with respect to the center face CF in order to weaken the electric field applied on the side of the semiconductor region 30 in the OFF state.

The semiconductor device 300i includes a plurality of thin film transistors TFT300i-1 to TFT300i-18. In each thin film transistor TFT300i, the shape of the gate electrode 350 is asymmetrical with respect to the center face CF in order to weaken the electric field applied on the side of the semiconductor region 30 in the OFF state.

Figure 18D:
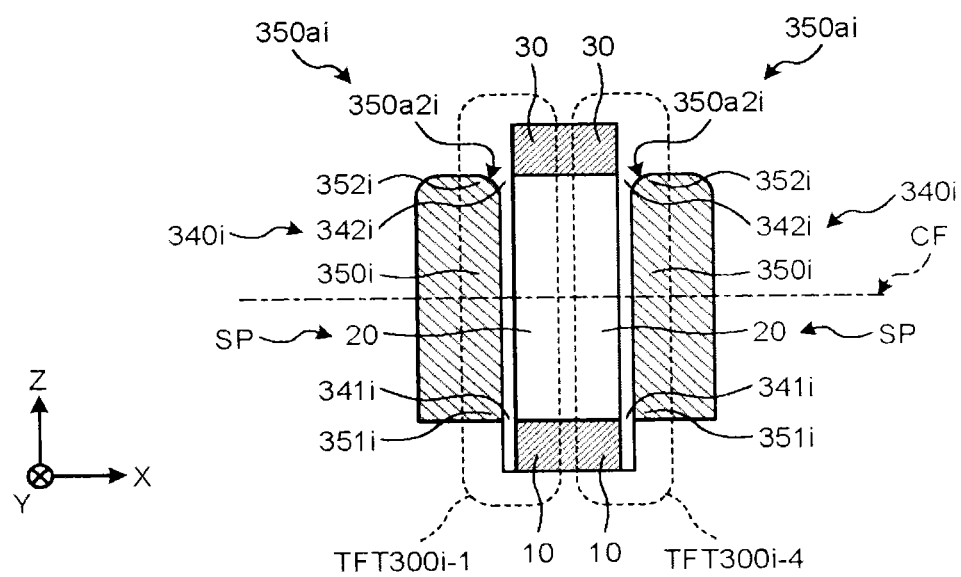

For example, as illustrated in FIG. 18D, the thin film transistor TFT300i-1 is configured such that a principal surface 350ai covering a gate insulating film 340i in the gate electrode 350i is curved so that a upper portion 350a2i is spaced apart from the semiconductor pillar SP. FIG. 18D is a cross-sectional view illustrating the vicinity of the thin film transistor in the structure of FIG. 18A on a magnified scale. Accordingly, the gate insulating film 340i is formed such that the film thickness of an upper portion 342i is thicker than that of a lower portion 341i. With this configuration, when the gate electrode 350i is seen in cross-sectional view, an edge 352i on a side of the semiconductor region 30 is roundish compared to an edge 351i on a side of the semiconductor region 10.

Similarly, as illustrated in FIG. 18D, the thin film transistor TFT300i-4 is configured such that the principal surface 350ai covering the gate insulating film 340i in the gate electrode 350i is curved so that the upper portion 350a2i is spaced apart from the semiconductor pillar SP. Accordingly, the gate insulating film 340i is formed such that the film thickness of the upper portion 342i is thicker than that of the lower portion 341i. With this configuration, when the gate electrode 350i is seen in cross-sectional view, the edge 352i on a side of the semiconductor region 30 is roundish compared to the edge 351i on a side of the semiconductor region 10.

Therefore, the electric field applied on the side of the semiconductor region 30 in the OFF state can be weakened in each thin film transistor TFT300i. As a result, in a case where the thin film transistor TFT300i is unselected when a predetermined memory cell is selected and reset from the low resistance state to the high resistance state, the GIDL current in the thin film transistor TFT300i can be suppressed. Therefore, since the GIDL current of each thin film transistor TFT300i in the OFF state can be suppressed, it is possible to suppress the current consumption in the semiconductor device 300i. Further, it is possible to easily secure a reset current Irst− required for flowing into the selected memory cell MC-14 as high a level as the memory cell can be reset from the low resistance state to the high resistance state.

Further, in each thin film transistor TFT300i, when each memory cell MC is configured to be set from the high resistance state to the low resistance state by making the voltage of the conductive line L1 (bit line) higher than that of the conductive line L2 (word line), it is possible to easily secure the electric field between the semiconductor region 10 serving as the drain and the gate electrode 350. With this configuration, it is possible to easily secure a drain current in the ON state of the thin film transistor TFT300i corresponding to the memory cell MC to be set. Therefore, it is possible to easily secure a reset current Iset+ required for flowing into the memory cell MC as high a level as the memory cell can be set from the high resistance state to the low resistance state.

Figure 19A:
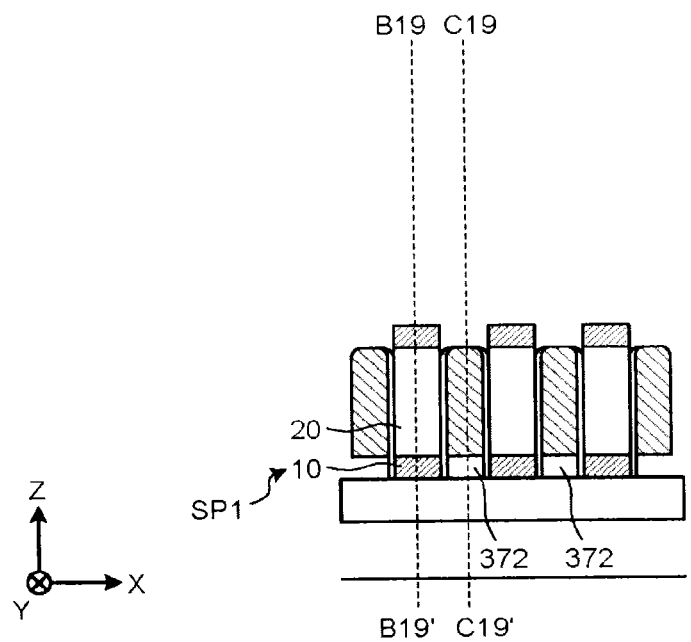
FIGS. 19A to 19C are diagrams illustrating a method of manufacturing the semiconductor device according to the modified example of the third embodiment.
Figure 19B:
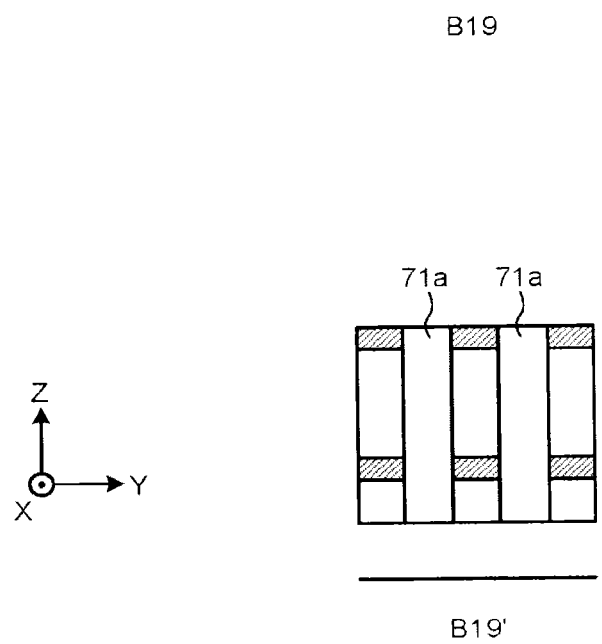
Figure 19C:
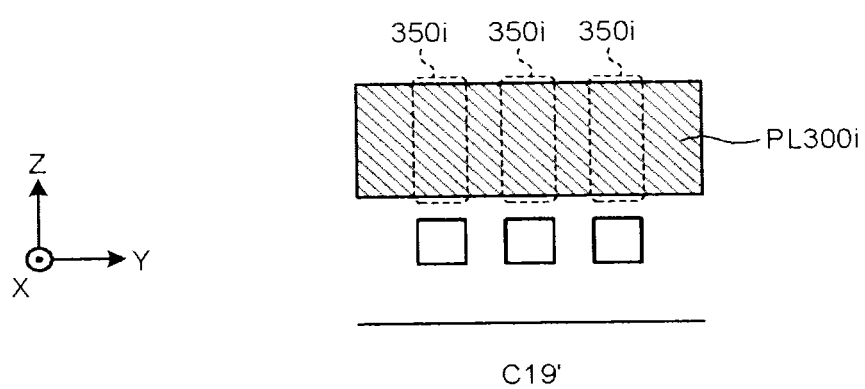

Further, the semiconductor device 300i may be manufactured by changing the manufacturing method of the first embodiment into that as illustrated in FIGS. 19A to 19C. FIGS. 19A to 19C are cross-sectional views illustrating procedures in the method of manufacturing the semiconductor device 300i.

The procedures illustrated in FIGS. 19A to 19C are performed after the procedures illustrated in FIGS. 6A to 6C. FIG. 19A is a cross-sectional view illustrating the procedures. FIG. 19B is a diagram illustrating a cross section taken along line B19-B19' of the structure in FIG. 19A. FIG. 19C is a diagram illustrating a cross section taken along line C19-C19' of the structure in FIG. 19A.

In the procedures illustrated in FIGS. 19A to 19C, the interlayer insulating film 372 which fills the plurality of grooves TR2 (see FIG. 5A) is partially removed by the RIE method using the hard mask HM2 (see FIG. 6A) as a mask. At this time, the etching period is adjusted such that the upper face of the interlayer insulating film 372 left in the groove TR2a becomes almost even in height with the boundary face between the semiconductor region 10 and the semiconductor region 20 in the semiconductor pillar SP1 from the surface SBa of the semiconductor substrate SB.

Then, the plurality of grooves TR2a are filled with a conductive material by the sputtering method. For example, the conductive material is deposited over the entire surface by the sputtering method. The conductive material may be formed of a material having a metal (for example, tungsten) as a main component thereof, or may be formed of a material having a semiconductor (for example, silicon) as a main component thereof which contains the first or second conductivity type of impurity.

Next, a resist pattern (not illustrated) is formed at a corresponding position on a member PL300i which is formed in the upper face of the conductive material. The resist pattern includes a plurality of line patterns corresponding to a plurality of members PL300i which is formed. In the XZ plane, each of the plurality of line patterns extends in the Y direction and its edge is roundish (the film thickness in the Z direction gradually decreases as it goes near to the semiconductor region 20). For example, such a resist pattern can be formed by performing reflow while heating the plurality of line patterns after forming the plurality of line patterns by the photolithography.

Then, the conductive material is etched through the resist pattern by the RIE method. In other words, the conductive material 51 is etched while each line pattern of which the edge is roundish is transferred onto the conductive material. Therefore, the member PL300i of which the upper edge is roundish can be left in each groove TR2a. In other words, the gate electrode 350i of which the upper edge is roundish is formed at a position where the member PL300i and the semiconductor pillar SP intersect. The subsequent procedures are the same as those in the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first line configured to extend in a first direction along a surface of a semiconductor substrate;
   a first transistor configured to be disposed above the first line,
   the first transistor including,
      a first semiconductor region which is provided in a first semiconductor layer extending in a second direction substantially perpendicular to the surface of the semiconductor substrate from the first line,
      a third semiconductor region which is provided, in the second direction, on an opposite side of the semiconductor substrate with respect to the first semiconductor region in the first semiconductor layer,
      a second semiconductor region which is provided, in the second direction, between the first semiconductor region and the third semiconductor region in the first semiconductor layer,
      a first gate insulating film which covers a first side face of the second semiconductor region, and
      a first gate electrode which covers the first side face of the second semiconductor region through the first gate insulating film;
   a second line configured to be connected to an upper face of the first semiconductor layer and to extend in the second direction;
   a plurality of third lines configured to extend along the surface of the semiconductor substrate and to intersect with the second line above the first transistor; and
   a plurality of memory cells configured to be disposed at positions where the second line and the plurality of third lines intersect,
   a face of the first gate electrode which abuts on the first gate insulating film being curved along the second direction so that a portion in the face on a side of the first semiconductor region is spaced apart from the first semiconductor layer, and
   a film thickness along the first direction of a first portion being thicker than a film thickness along the first direction of a second portion, the first portion being a portion that is on a side of the first semiconductor region in the first gate insulating film, the second portion being portion that is on a side of the third semiconductor region in the first gate insulating film.

2. A semiconductor device comprising:
a first line configured to extend in a first direction along a surface of a semiconductor substrate;
a first transistor configured to be disposed above the first line,
the first transistor including,
   a first semiconductor region which is provided in a first semiconductor layer extending in a second direction substantially perpendicular to the surface of the semiconductor substrate from the first line,
   a third semiconductor region which is provided, in the second direction, on an opposite side of the semiconductor substrate with respect to the first semiconductor region in the first semiconductor layer,
   a second semiconductor region which is provided, in the second direction, between the first semiconductor region and the third semiconductor region in the first semiconductor layer,
   a first gate insulating film which covers a first side face of the second semiconductor region, and
   a first gate electrode which covers the first side face of the second semiconductor region through the first gate insulating film;
a second line configured to be connected to an upper face of the first semiconductor layer and to extend in the second direction;
a plurality of third lines configured to extend along the surface of the semiconductor substrate and to intersect with the second line above the first transistor; and
a plurality of memory cells configured to be disposed at positions where the second line and the plurality of third lines intersect,
a face of the first gate electrode which abuts on the first gate insulating film being curved along the second direction so that a portion in the face on a side of the third semiconductor region is spaced apart from the first semiconductor layer, and
a film thickness along the first direction of a second portion being thicker than a film thickness along the first direction of a first portion, the first portion being a portion that is on a side of the first semiconductor region in the first gate insulating film, the second portion being a portion that is on a side of the third semiconductor region in the first gate insulating film.

3. A semiconductor device comprising:
a first line configured to extend in a first direction along a surface of a semiconductor substrate; and
a first transistor configured to be disposed above the first line,
the first transistor including,
   a first semiconductor region which is provided in a first semiconductor layer extending in a second direction substantially perpendicular to the surface of the semiconductor substrate from the first line,
   a third semiconductor region which is provided, in the second direction, on an opposite side of the semiconductor substrate with respect to the first semiconductor region in the first semiconductor layer,
   a second semiconductor region which is provided, in the second direction, between the first semiconductor region and the third semiconductor region in the first semiconductor layer,
   a first gate insulating film which covers a first side face of the second semiconductor region, and
   a first gate electrode which covers the first side face of the second semiconductor region through the first gate insulating film, a face of the first gate electrode which abuts on the first gate insulating film being curved along the second direction so that a portion in the face on a side of the third semiconductor region is spaced apart from the first semiconductor layer, a film thickness along the first direction of a second portion being thicker than a film thickness along the first direction of a first portion, the first portion being a portion that is on a side of the first semiconductor region in the first gate insulating film, the second portion being a portion that is on a side of the third semiconductor region in the first gate insulating film.

4. The semiconductor device according to claim 3, wherein a curvature of an end of the first gate electrode on a side of the first semiconductor region is larger than a curvature of an end of the first gate electrode on a side of the third semiconductor region.

5. The semiconductor device according to claim 4, further comprising:
a second line configured to be connected to an upper face of the first semiconductor layer and to extend in the second direction;
a plurality of third lines configured to extend along the surface of the semiconductor substrate and to intersect with the second line above the first transistor; and
a plurality of memory cells configured to be disposed at positions where the second line and the plurality of third lines intersect.

6. The semiconductor device according to claim 1, wherein the memory cell is reset from a low resistance state to a high resistance state by making voltage of the first line higher than voltage of the third line.

7. The semiconductor device according to claim 1, wherein a curvature of an end of the first gate electrode on a side of the first semiconductor region is larger than a curvature of an end of the first gate electrode on a side of the third semiconductor region.

8. The semiconductor device according to claim 2, wherein the memory cell is reset from a low resistance state to a high resistance state by making voltage of the third line higher than voltage of the first line.

9. The semiconductor device according to claim 1, wherein the second line is a second semiconductor layer.

10. The semiconductor device according to claim 2, wherein the second line is a second semiconductor layer.

11. The semiconductor device according to claim 5, wherein the second line is a second semiconductor layer.

* * * * *